(12) United States Patent
Ikeda

(10) Patent No.: US 7,164,593 B2
(45) Date of Patent: Jan. 16, 2007

(54) SEMICONDUCTOR INTEGRATED CIRCUIT

(75) Inventor: Yuuichirou Ikeda, Kobe (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 82 days.

(21) Appl. No.: 10/850,116

(22) Filed: May 21, 2004

(65) Prior Publication Data
US 2004/0232567 A1   Nov. 25, 2004

(30) Foreign Application Priority Data
May 23, 2003   (JP)  ............................ 2003-145964

(51) Int. Cl.
*G11C 5/06* (2006.01)
(52) U.S. Cl. .................. 365/63; 365/149; 365/154; 257/371
(58) Field of Classification Search ................ 365/63, 365/149, 154; 257/371
See application file for complete search history.

(56) References Cited

U.S. PATENT DOCUMENTS

| | | | |
|---|---|---|---|
| 4,233,672 A | 11/1980 | Suzuki et al. | |
| 5,404,042 A | * 4/1995 | Okumura et al. | ........... 257/371 |
| 6,501,116 B1 | * 12/2002 | Kisu et al. | ................. 365/149 |
| 2003/0099148 A1 | 5/2003 | Slamowitz | |

FOREIGN PATENT DOCUMENTS

JP   1139879   2/1999

OTHER PUBLICATIONS

J. Lohstroh, et al.; "Worst-Case Static Noise Margin Criteria for Logic Circuits and Their Mathematical Equivalence," IEEE Journal of Solid-State Circuits, vol. sc-18, No. 16. Dec. 1983, pp. 803-807.

* cited by examiner

*Primary Examiner*—Huan Hoang
(74) *Attorney, Agent, or Firm*—Stevens, Davis, Miller & Mosher, LLP

(57) ABSTRACT

A storage section, at least one writing section, and at least one reading section are provided on a substrate. A storage-section substrate region in which the storage section is formed, at least one writing-section substrate region in which each writing section is formed, at least one reading-section substrate region in which each reading section is formed are insulatedly isolated from each other on the substrate. Independent substrate potentials are applied to each substrate region.

34 Claims, 21 Drawing Sheets

FIG. 15

|  | Forward bias | Back bias | |
|---|---|---|---|
| Writing section | High-speed write mode | Cross-talk immunity improvement mode | Low leakage current mode |
| Storage section | | Storage mode | |
| Reading section | High-speed read mode | | |

SEMICONDUCTOR INTEGRATED CIRCUIT

BACKGROUND OF THE INVENTION

1. Field of the Invention

The present invention relates to a semiconductor integrated circuit which comprises a storage circuit including a storage section on a semiconductor substrate. The present invention relates particularly to a semiconductor integrated circuit which comprises a storage circuit, such as a register file and an SRAM (Static Random Access Memory), and uses a substrate potential effect.

2. Description of the Related Art

In terms of a semiconductor integrated circuit which comprises a storage circuit, there exists a semiconductor integrated circuit which is configured as shown in FIG. 21 (for example, refer to Japanese Patent Application Laid-Open (JP-A) No. 11-39879 (paragraph 0018, FIG. 3)). The storage section comprises two inverters 210 and 220 in this semiconductor integrated circuit. One inverter 210 is comprised of a P-channel MOS FET 211 and an N-channel MOS FET 212. The other inverter 220 is comprised of a P-channel MOS FET 221 and an N-channel MOS FET 222.

In addition, there is provided a circuit which selectively changes a substrate potential applied to a semiconductor substrate in which the P-channel MOS FETs 211 and 221, and the N-channel MOS FETs 212 and 222 are formed. This circuit is comprised of a switch consisting of P-channel MOS FETs 231 and 232, N-channel MOS FETs 241 and 242, and switches the substrate potential applied to the substrate with switching control signals 251 and 252.

Thus, the circuit changes a threshold voltage of each of MOS FETs 211, 212, 221, and 222 depending upon the storage section being in an active mode or a sleep mode, so that power consumption is suppressed with maintaining high-speed operation at a required time.

When selectively changing the substrate potential of the storage section, a forward bias is applied during staying in an active mode, and a back bias is applied during staying in a sleep mode as shown in FIG. 21. It is therefore possible to achieve an improvement in speed of circuit operation and a reduction in leakage current, respectively, as compared with a case where the substrate potential of the storage section is not changed.

However, the storage circuit such as SRAMs or the like includes a writing section and a reading section for writing/reading data in/from the storage section other than the storage section, and includes many writing sections and reading sections particularly in a multi-port memory. In this case, circuit operation mainly depends on the P-channel MOS FET and the N-channel MOS FET in the writing section and the reading section rather than the storage section. Therefore, in order to achieve an improvement in speed of circuit operation and a reduction in leakage current, it is insufficient just to control the substrate potential only for the P-channel MOS FET and the N-channel MOS FET in the storage section like a prior art.

In addition, there exist operations in connection with the writing section and the reading section other than an active mode and a sleep mode of the storage section as a circuit operation in the semiconductor integrated circuit including the storage circuit, but a method of the prior art can not set how to apply the substrate potential suitable for these operations.

Moreover, an isolation region is required in order to isolate the substrate, but reference is not made about an increase in layout circuit area because of this isolation region in the prior art.

SUMMARY OF THE INVENTION

The object of the present invention is to provide a semiconductor integrated circuit capable of sufficiently achieving an improvement in speed of circuit operation, and a reduction in leakage current.

In order to solve the problems described above, a semiconductor integrated circuit of the present invention comprises a storage circuit having a storage section, a writing section, and a reading section; and a substrate in which the storage circuit is formed is isolated into a plurality of regions.

The substrate in which the storage circuit is formed is isolated into a plurality of regions according to this configuration, so that a suitable substrate potential can be independently applied to every isolated region. For example, the storage section and each region of the reading section can be isolated, the storage section and each region of the writing section can be isolated, each region of the reading section and each region of the writing section can be isolated, and the storage section, each region of the reading section, and each region of the writing section can be isolated. Consequently, a substrate potential of the storage section, a substrate potential of the writing section, and a substrate potential of the reading section can be controlled independently of other substrate potential, which has been impossible in the prior art. As a result, it is possible to sufficiently achieve an improvement in speed of circuit operation and a reduction in leakage current.

In a semiconductor integrated circuit of the present invention, it is preferable that the substrate is isolated into a storage-section substrate region in which the storage section is formed, at least one writing-section substrate region in which the writing section is formed, and at least one reading-section substrate region in which the reading section is formed.

The substrate is isolated into the storage-section substrate region, the writing-section substrate region, and the reading-section substrate region according to this configuration, so that suitable substrate potentials can be applied to the storage-section substrate region, the writing-section substrate region, and the reading-section substrate region, respectively, depending on operating states of the storage section, the writing section, and the reading section. In other words, it is possible to change the substrate potentials applied to the storage-section substrate region, the writing-section substrate region, and the reading-section substrate region, which has been impossible in the prior art. As a result, it is possible to sufficiently achieve an improvement in speed of circuit operation and a reduction in leakage current.

In a configuration where the substrate is isolated into the storage-section substrate region, the writing-section substrate region, and the reading-section substrate region as described above, it is preferable that independent substrate potentials are applied to storage-section substrate region, writing-section substrate region, and reading-section substrate region.

The optimum substrate potential can be independently applied to storage-section substrate region, writing-section substrate region, and reading-section substrate region, respectively, depending on the operating states of the storage section, the writing section, and the reading section according to this configuration, and thereby it is possible to further achieve an improvement in speed of circuit operation and a reduction in leakage current.

In a configuration where the substrate is isolated into the storage-section substrate region, the writing-section substrate region, and the reading-section substrate region as described above, it is preferable to apply a forward bias to both or either of the storage-section substrate region and/or the writing-section substrate region.

A forward bias is applied to both or either of the storage-section substrate region and/or the writing-section substrate region according to this configuration, and thereby it is possible to achieve an improvement in speed of data writing operation in the storage section.

In a configuration where the substrate is isolated into the storage-section substrate region, the writing-section substrate region, and the reading-section substrate region as described above, it is preferable that a back bias is applied to the writing-section substrate region.

A back bias is applied to the writing-section substrate region according to this configuration, and thereby it is possible to achieve an improvement in cross-talk immunity.

In a configuration where the substrate is isolated into the storage-section substrate region, the writing-section substrate region, and the reading-section substrate region as described above, it is preferable that a back bias is applied to the storage-section substrate region.

A back bias is applied to the storage-section substrate region according to this configuration, and thereby it is possible to achieve an improvement in storage capability in the storage section.

In a configuration where the substrate is isolated into the storage-section substrate region, the writing-section substrate region, and the reading-section substrate region as described above, it is preferable that a forward bias is applied to the reading-section substrate region.

A forward bias is applied to the reading-section substrate region according to this configuration, and thereby it is possible to achieve an improvement in speed of data reading operation from the storage section.

In a configuration where the substrate is isolated into the storage-section substrate region, the writing-section substrate region, and the reading-section substrate region as described above, it is preferable that a back bias is applied to all or at least one of the storage-section substrate region, the writing-section substrate region, and the reading-section substrate region.

A back bias is applied to all or at least one of the storage-section substrate region, the writing-section substrate region, and the reading-section substrate region according to this configuration, and thereby it is possible to achieve an improvement in leakage current.

In a configuration where the substrate is isolated into the storage-section substrate region, the writing-section substrate region, and the reading-section substrate region as described above, it is preferable that the semiconductor integrated circuit comprises a high-speed write mode by which a forward bias is applied to both or either of the storage-section substrate region and/or the writing-section substrate region; a cross-talk immunity improvement mode by which a back bias is applied to the writing-section substrate region; a high-speed read mode by which a forward bias is applied to the reading-section substrate region; a storage mode by which a back bias is applied to the storage-section substrate region; and a low leakage current mode by which a back bias is applied to all or at least one of the storage-section substrate region, the writing-section substrate region, and the reading-section substrate region; and that a transition is made to either of the high-speed write mode, the cross-talk immunity improvement mode, the high-speed read mode, the storage mode, or the low leakage current mode depending on the operating states of the storage section, the writing section, and the reading section.

The operation mode is set depending on the operating states of the storage section, the writing section, and the reading section, and the substrate potential applied to the storage-section substrate region, the writing-section substrate region, and the reading-section substrate region is properly set for every operation mode according to this configuration, so that a transition is made between respective operation modes according to a change in the operating states of the storage section, the writing section, and the reading section, and thereby it is possible to apply the optimum substrate potential to the storage-section substrate region, the writing-section substrate region, and the reading-section substrate region, respectively, depending on the operating states of the storage section, the writing section, and the reading section. It is therefore possible to achieve an improvement in speed of data writing operation, an improvement in cross-talk immunity, an improvement in speed of data reading operation, an improvement in storage capability of the storage section, and a reduction in leakage current.

When a transition is made between a plurality of mode types as described above, it is preferable that a transition is made to the high-speed write mode in writing data in the storage section.

A forward bias is applied to both or either of the storage-section substrate region and/or the writing-section substrate region according to this configuration, and thereby it is possible to achieve an improvement in speed of data writing operation in the storage section.

When a transition is made between a plurality of mode types as described above, if there exists the writing section which does not write data in the storage section, it is preferable that the writing-section substrate region in which the writing section which does not write data in the storage section is formed is made a transition to the cross-talk immunity improvement mode.

A back bias is applied to the writing-section substrate region according to this configuration, and thereby it is possible to achieve an improvement in cross-talk immunity.

When a transition is made between a plurality of mode types as described above, it is preferable to make a transition to the high-speed read mode in reading data from the storage section.

A forward bias is applied to the reading-section substrate region according to this configuration, and thereby it is possible to achieve an improvement in speed of data reading operation from the storage section.

When a transition is made between a plurality of mode types as described above, it is preferable to make a transition to the storage mode in not writing data in the storage section.

A back bias is applied to the storage-section substrate region according to this configuration, and thereby it is possible to achieve an improvement in storage capability in the storage section.

When a transition is made between a plurality of mode types as described above, it is preferable to make a transition to the low leakage current mode in not reading data from the storage section and not writing data in the storage section.

A back bias is applied to all or at least one of the storage-section substrate region, the writing-section substrate region, and the reading-section substrate region according to this configuration, and thereby it is possible to achieve an improvement in leakage current.

When a transition is made between a plurality of mode types as described above, it is preferable that the operating states of the storage section, the writing section, and the reading section are predicted, and then a transition is made to either of the high-speed write mode, the cross-talk immunity improvement mode, the high-speed read mode, the storage mode, or the low leakage current mode depending on the prediction result.

The operating states of the storage section, the writing section, and the reading section are predicted, and then a transition of the operation mode is precedingly made depending on the prediction result according to this configuration, so that a delay of mode transition operation can be solved, and thereby it is possible to make a transition of operation mode based on actual circuit operation.

In a configuration where the substrate is isolated into the storage-section substrate region, the writing-section substrate region, and the reading-section substrate region as described above, it is preferable that the semiconductor integrated circuit has a configuration where a plurality of storage circuits are adjacently provided, and that all of the adjacent storage-section substrate regions, all of the adjacent writing-section substrate regions, and all of the adjacent reading-section substrate regions are unified, respectively, in a plurality of adjacent storage circuits.

All of the adjacent storage-section substrate regions, all of the adjacent writing-section substrate regions, and all of the adjacent reading-section substrate regions are unified, respectively according to this configuration, and thereby it is possible to achieve a reduction in layout circuit area of the storage circuit on the substrate.

In a configuration where the substrate is isolated into the storage-section substrate region, the writing-section substrate region, and the reading-section substrate region as described above, it is preferable that the semiconductor integrated circuit has a configuration provided with a plurality of storage circuits being adjacent, and that all of the adjacent storage-section substrate regions, all of the adjacent writing-section substrate regions, and all of the adjacent reading-section substrate regions are unified, respectively, in a plurality of adjacent storage circuits, and thereby an isolation region is eliminated.

All of the adjacent storage-section substrate regions, all of the adjacent writing-section substrate regions, and all of the adjacent reading-section substrate regions are unified, respectively according to this configuration, so that the isolation region is eliminated, and thereby it is possible to achieve a reduction in layout circuit area of the storage circuit on the substrate.

In a configuration where the substrate is isolated into the storage-section substrate region, the writing-section substrate region, and the reading-section substrate region as described above, it is preferable that the semiconductor integrated circuit has a configuration provided with a plurality of storage circuits being adjacent, and that all of the adjacent storage-section substrate regions, all of the adjacent writing-section substrate regions, and all of the adjacent reading-section substrate regions are unified, respectively in a plurality of adjacent storage circuits, so that power supply interconnections for applying substrate potentials between the adjacent storage-section substrate regions, between the adjacent writing-section substrate regions, and between the adjacent reading-section substrate regions are eliminated.

All of the adjacent storage-section substrate regions, all of the adjacent writing-section substrate regions, and all of the adjacent reading-section substrate regions are unified, respectively according to this configuration, so that the power apply interconnections for applying the substrate potentials between the adjacent storage-section substrate regions, between the adjacent writing-section substrate regions, and between the adjacent reading-section substrate regions are eliminated, and thereby it is possible to achieve a reduction in layout circuit area of the storage circuit on the substrate.

BRIEF DESCRIPTION OF THE DRAWINGS

FIG. 15 is a schematic block diagram showing a relationship between operation modes and substrate potentials in a second embodiment of the present invention;

PREFERRED EMBODIMENTS (First Embodiment)

Hereafter, description will be made of a first embodiment of a semiconductor integrated circuit of the present invention based on the drawings.

Figure 1:
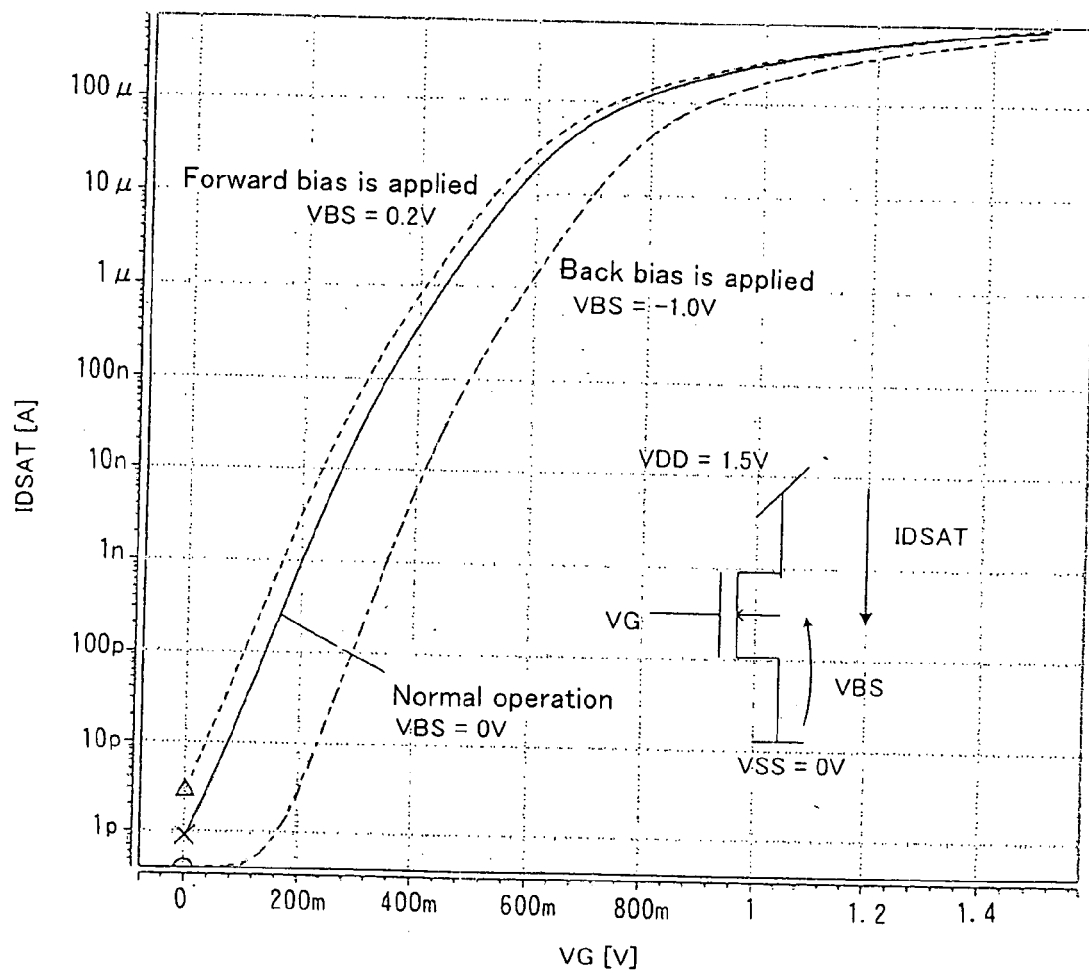
FIG. 1 is a graph showing gate voltage-saturation current characteristic dependence on various substrate potentials in an N-channel MOS FET.

In order to explain a substrate potential effect, there is shown a graph in FIG. 1 showing dependence of a gate voltage VG and a drain-source saturation current IDSAT on a substrate-source voltage VBS of an N-channel MOS FET. In FIG. 1, there are shown dependence in a state where the substrate-source voltage VBS is 0.2 V, and dependence in a state where the substrate-source voltage VBS is −1.0 V in broken lines, respectively, and is shown dependence in a state where the substrate-source voltage VBS is 0 V in solid line. In this example, a voltage VDD is 1.5 V and a voltage VSS is 0 V.

Figure 2:
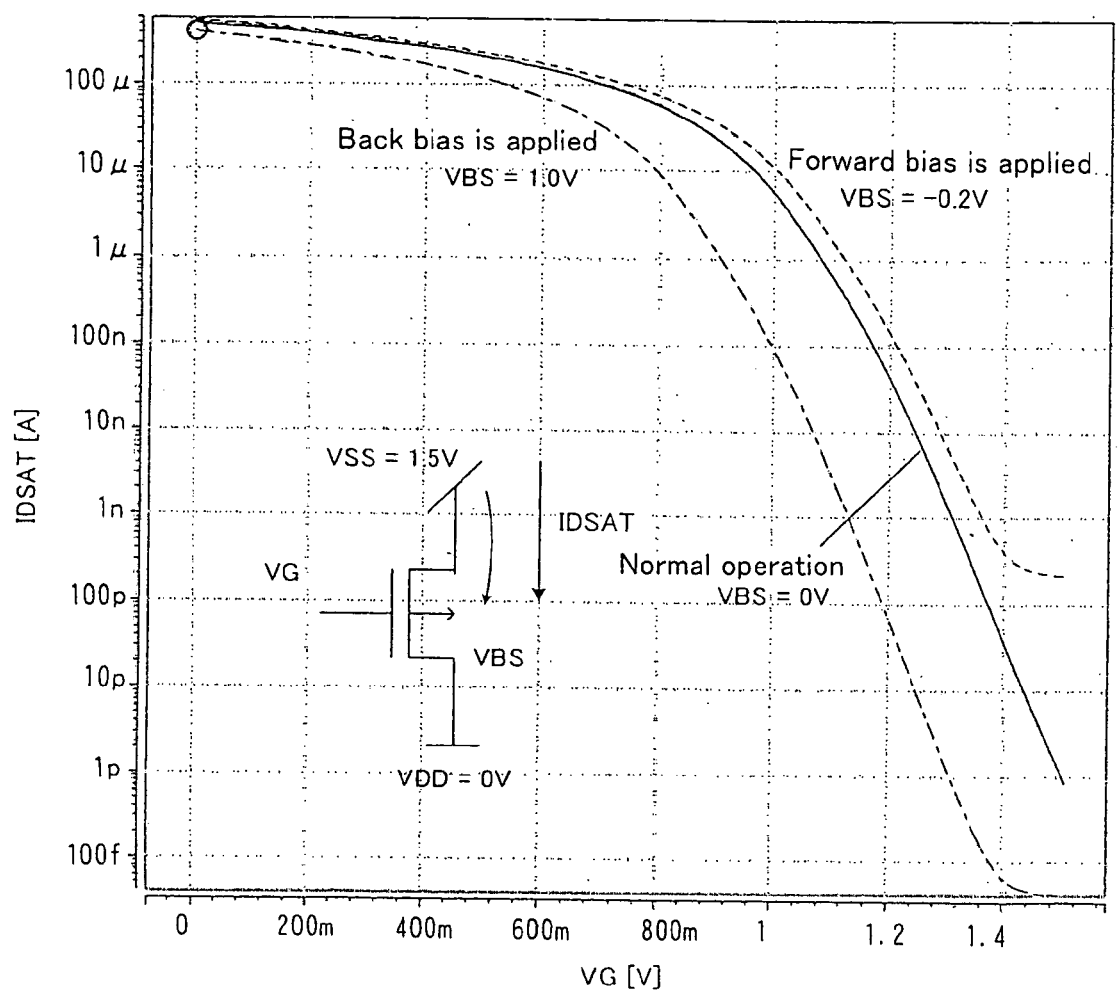
FIG. 2 is a graph showing gate voltage-saturation current characteristic dependence on the various substrate potentials in a P-channel MOS FET.

There is shown a graph in FIG. 2 showing dependence of the gate voltage VG and the drain-source saturation current IDSAT on the substrate-source voltage VBS of a P-channel MOS FET. In FIG. 2, there are shown dependence in a state where the substrate-source voltage VBS is −0.2 V, and dependence in a state where the substrate-source voltage VBS is 1.0 V in broken lines, respectively, and is shown dependence in a state where the substrate-source voltage VBS is 0 V in solid line. In this example, the voltage VDD is 1.5 V and the voltage VSS is 0 V.

Herein, to apply a positive voltage to the N-channel MOS FET as the substrate-source voltage VBS is called a forward bias, and to apply a negative voltage thereto as the substrate-source voltage VBS is called a negative bias. In addition, to apply a negative voltage to the P-channel MOS FET as the substrate-source voltage VBS is called a forward bias, and to apply a positive voltage thereto as the substrate-source voltage VBS is called a back bias. Moreover, the substrate-source voltage VBS is called the substrate potential. Incidentally, a state where the substrate potential VBS is 0 V is generally called a normal state.

When the forward bias is applied, the drain-source saturation current IDSAT is higher than that in the normal state, and when the back bias is applied, the drain-source saturation current IDSAT is lower than that in the normal state under the same gate voltage VG due to the substrate potential effect as shown in FIG. 1 and FIG. 2.

In addition, as will readily be understood from FIG. 1 and FIG. 2, when the MOS FET turns off, the drain-source saturation current IDSAT during the back bias is lower as compared with the normal state, namely resulting in a lower leakage current. It is therefore possible to control the drain-source saturation current IDSAT and the leakage current of the MOS FET by means of changing the substrate potential.

As a definition of stability regarding a storage section, there exists "Static Noise Margin" included in "Worst-case Static Noise Margin Criteria for Logic Circuits and their Mathematical Equivalence", IEEE J. Solid-State Circuits, vol. sc-18, pp. 803–807, published in December 1983 written by J. Lohstroh et al. When input/output characteristics of two inverters comprising the storage section are determined, and then one inverter is drawn by mirroring, the "Static Noise Margin" is given by a length of one side of a square inscribed in two curves. The longer the length of this side, the higher stability of the storage section, and the harder the inversion of the storage data occurs.

Figure 3:
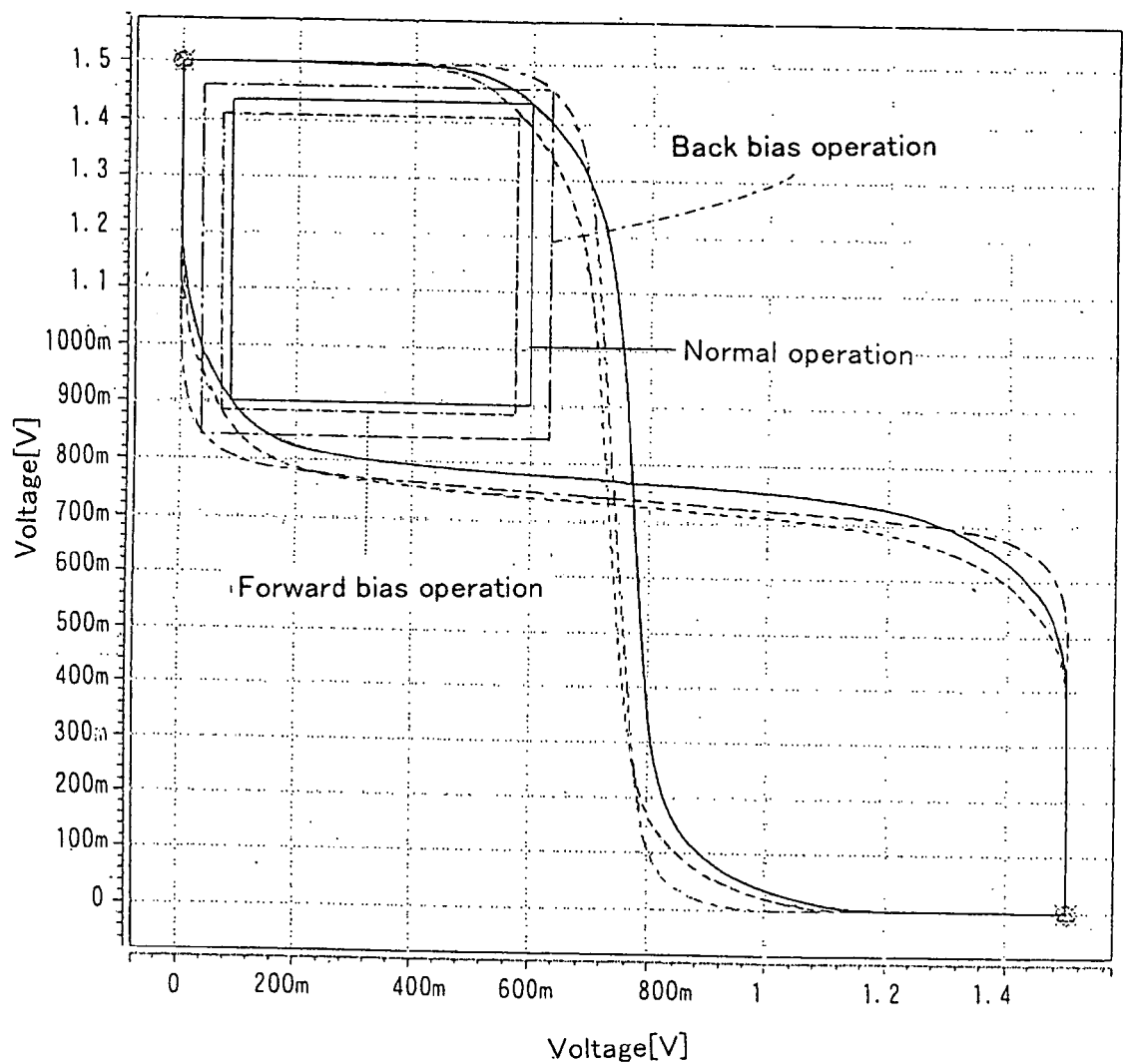
FIG. 3 is a graph showing "Static Noise Margin" dependence on various substrate potentials.

The input/output characteristics of the inverters and its mirroring are shown together in FIG. 3 when the substrate potential is applied to two inverters comprising the storage section. There is shown in FIG. 3 that stability of the storage data is higher when the back bias is applied to the substrate of the storage section, and stability of the storage data is lower when the forward bias is applied thereto compared with the normal state. It is therefore possible to control data stability in the storage section, namely data storage strength, by means of changing the substrate potential of the storage section.

In the semiconductor integrated circuit including the storage section, it is possible to control the drain-source saturation current IDSAT, the leakage current, and stability of the storage data in the storage section of the MOS FET by means of variously controlling the substrate potential as mentioned above, and thereby effects, such as an improvement in speed of circuit operation, reduction in power dissipation, or the like can be achieved by utilizing these.

Based on the drawings, description will be made of embodiments of the present invention in full detail below.

Figure 4:
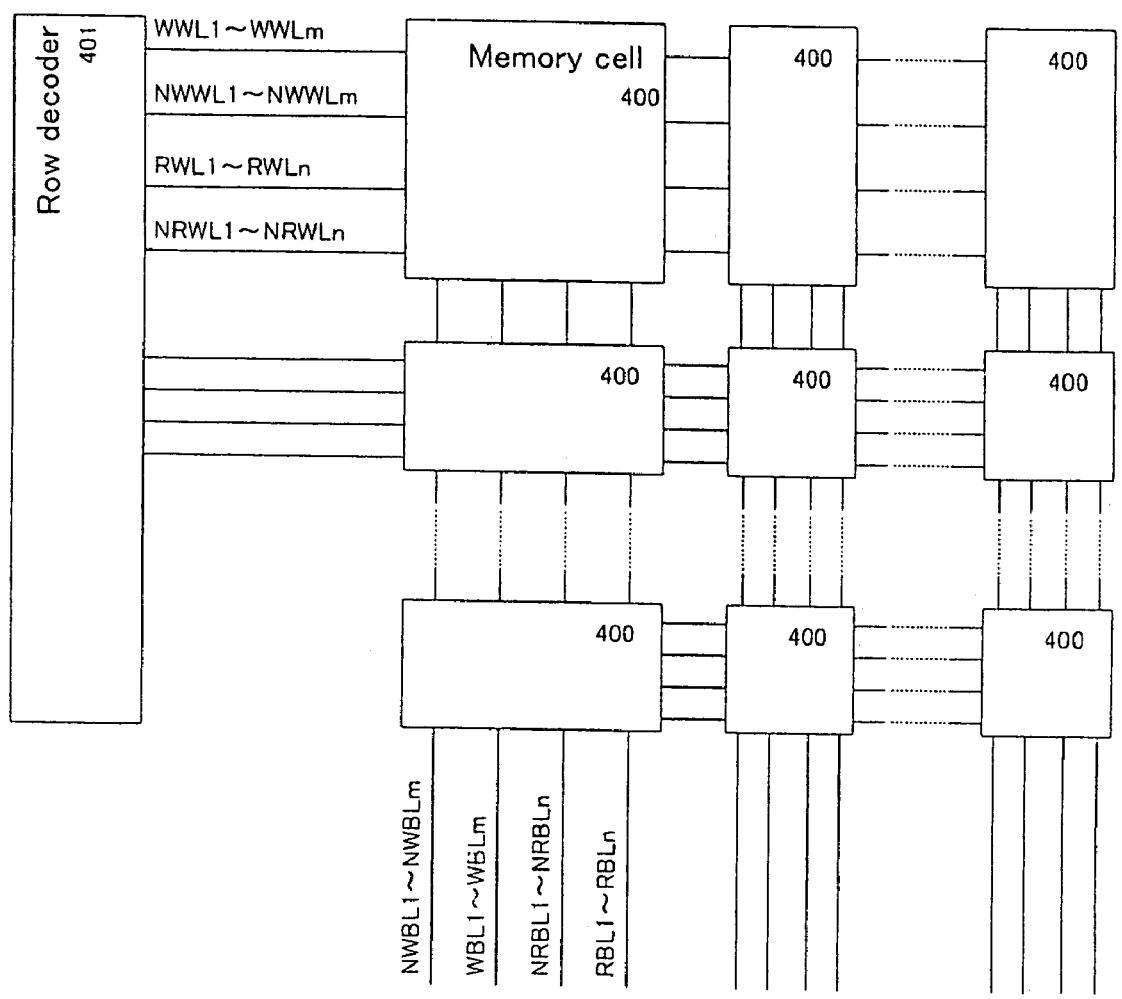
FIG. 4 is a circuit diagram showing a configuration of memory cells and peripheral circuits as a storage circuit in a first embodiment of the present invention.
Figure 5A:
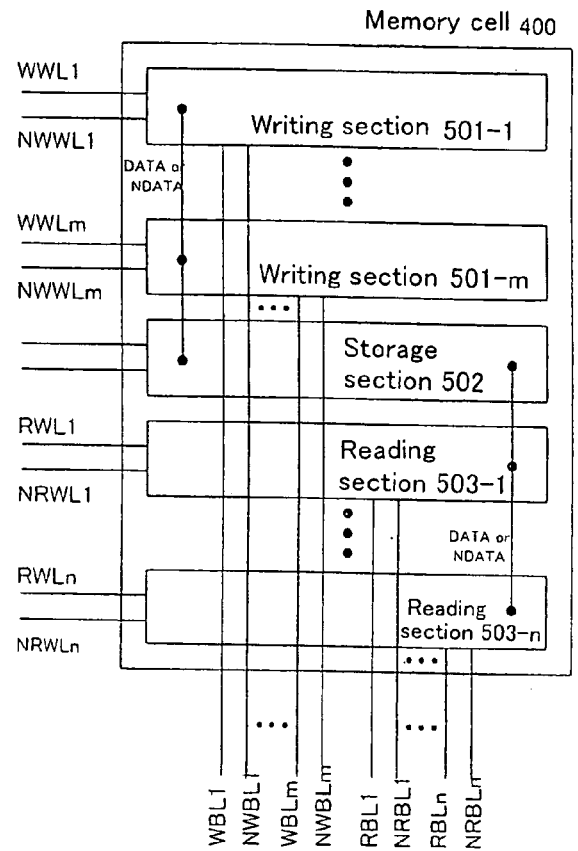
FIG. 5A is a circuit block diagram showing a configuration of the memory cell in the first embodiment of the present invention.
Figure 5B:
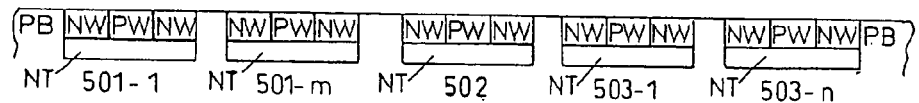
FIG. 5B is a sectional view showing a configuration of the memory cell in the first embodiment of the present invention.

FIG. 4 is a circuit diagram showing memory cells and peripheral circuits as a storage circuit in the first embodiment of the present invention, and FIG. 5A and FIG. 5B are circuit diagrams showing a configuration of the memory cell in connection with the first embodiment of the present invention. Referring to FIG. 4, reference numeral 400 represents a single memory cell or a plurality of memory cells arranged in an array shape, and reference numeral 401 represents a row decoder. Referring to FIG. 5A and FIG. 5B, reference numerals 501-1 through 501-m, (m is an integer equal to one or more) represent first through m, m in number writing sections, reference numeral 502 represents a storage section, and reference numerals 503-1 through 503-n (n is an integer equal to one or more) represent first through n, n in number reading sections.

The plurality of memory cells 400 are arranged so as to align in a row direction and a column direction, respectively. In addition, write word lines WWL1 through WWLm, inverted write word lines NWWL1 through NWWLm (m is an integer equal to one or more), read word lines RWL1 through RWLn, and inverted read word lines NRWL1 through NRWLn (n is an integer equal to one or more) are arranged along each row direction so as to connect the memory cell 400 arranged in a row direction with each other.

The write word lines WWL1 through WWLm, the inverted write word lines NWWL1 through NWWLm, the read word lines RWL1 through RWLn, and the inverted read word lines NRWL1 through NRWLn mentioned above are selected by the row decoder 401 based on a row address supplied from an external source. However, a part of the write word lines WWL1 through WWLm, the inverted write word lines NWWL1 through NWWLm, the read word lines RWL1 through RWLn, and the inverted read word lines NRWL1 through NRWLn mentioned above may not exist depending on a configuration of the memory cell 400.

In addition, write bit lines WBL1 through WBLm, inverted write bit lines NWBL1 through NWBLm, read bit lines RBL1 through RBLn, and inverted read bit lines NRBL1 through NRBLn are arranged along each column direction so as to connect the memory cell 400 arranged in a column direction with each other.

However, a part of the write bit lines WBL1 through WBLm, the inverted write bit lines NWBL1 through NWBLm, the read bit line RBL1 through RBLn, and the inverted read bit lines NRBL1 through NRBLn mentioned above may not exist depending on a configuration of the memory cell 400.

Moreover, the memory cell 400 is comprised of at least one of the writing sections 501-1 through 501-m, the storage section 502, and at least one of the reading sections 503-1 through 503-n as shown in FIG. 5A. A writing-section substrate region, a storage-section substrate region, and a reading-section substrate region on the substrate are isolated from each of the writing sections 501-1 through 501-m, the storage section 502, and each of the reading sections 503-1 through 503-n, so that the substrate potential can be applied independently. In other words, it is possible to set them at different potentials independently.

Two examples of an isolation structure of each substrate region are shown in FIG. 5B. In FIG. 5B, symbol NW and PW represent an n-substrate region and a p-substrate region, respectively, for forming a transistor, and symbol NT and PT represent an n-substrate and a p-substrate, respectively, for isolating between each p-substrate region PW and each n-substrate region NW, and symbol PB represents a p-substrate. The n-substrate NT and the n-substrate region NW may have substantially the same or different impurity concentrations, and the p-substrate PB, the p-substrate PT, and the p-substrate region PW are also similar to that mentioned above. Further, in FIG. 5B, a configuration where the n-type region and the p-type region are replaced with each other is also possible.

Moreover, each of the writing sections 501-1 through 501-m and the storage section 502, and each of the reading sections 503-1 through 503-n and the storage section 502 are connected by a data line DATA or an inverted data line NDATA.

Figure 6:
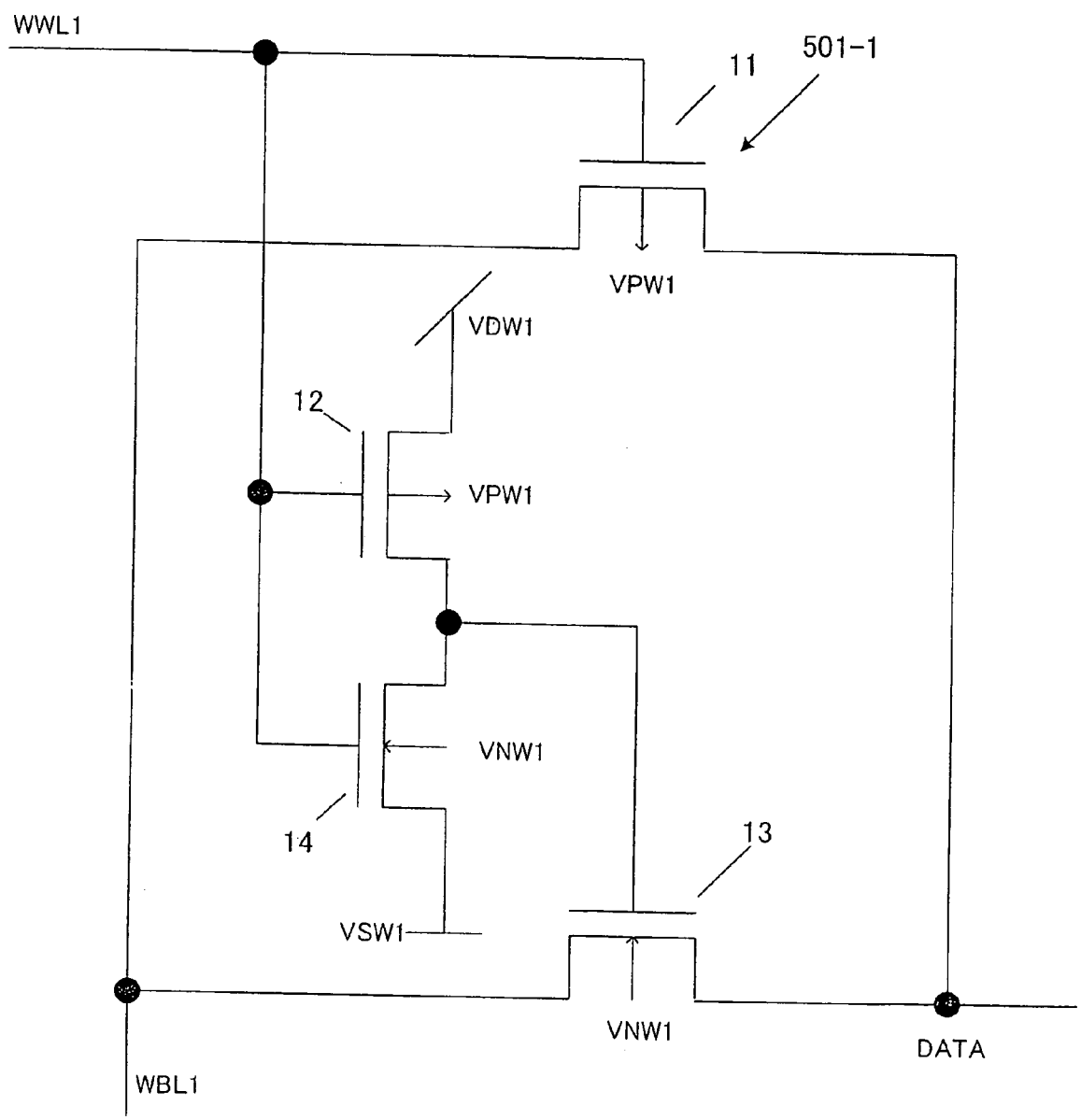
FIG. 6 is a circuit diagram showing a first configuration of a writing section in the first embodiment of the present invention.

A specific example of the writing sections 501-1 through 501-m in FIG. 5A and FIG. 5B is shown in FIG. 6. Hereafter, description will be made about one writing section 501-1 as a typical example for convenience and similar thing may also be said to other writing sections 501-2 through 501-m. In FIG. 6, reference numerals 11 and 12 are P-channel MOS FETs, respectively, and reference numerals 13 and 14 are N-channel MOS FETs, respectively.

In the writing section 501-1, a selection potential VDW1 or a non-selection potential VSW1 is applied to the write word line WWL1 from the row decoder 401. The substrate region of the writing section 501-1 shown in FIG. 6 is isolated from the substrate region of each of the writing sections 501-2 through 501-m, the substrate region of the storage section 502, and the substrate region of each of the reading sections 503-1 through 503-n.

In this writing section 501-1, a substrate potential VNW1 to be a forward bias is applied to the N-channel MOS FETs 13 and 14, and a substrate potential VPW1 to be a forward bias is applied to the P-channel MOS FETs 11 and 12, and thereby it is possible to increase the drain-source saturation current IDSAT of each of MOS FETs 11 through 14. It is therefore possible to achieve an improvement in speed of data writing operation.

In addition, the substrate potential VNW1 to be a back bias is applied to the N-channel MOS FETs 13 and 14, and the substrate potential VPW1 to be a back bias is applied to the P-channel MOS FETs 11 and 12 in FIG. 6, and thereby it is possible to decrease the drain-source saturation current IDSAT of each MOS FET. That is, it will be in a state of being hard to write data in the storage section 502. For this reason, when the write word line WWL1 stays in a non-selection potential, if the write word line WWL1 is superimposed with noise from other write word lines, read word lines, or the like, incorrect writing operation is hard to be made by means of applying the back biases as described above. It is therefore possible to improve cross-talk immunity between the word lines.

Figure 7:
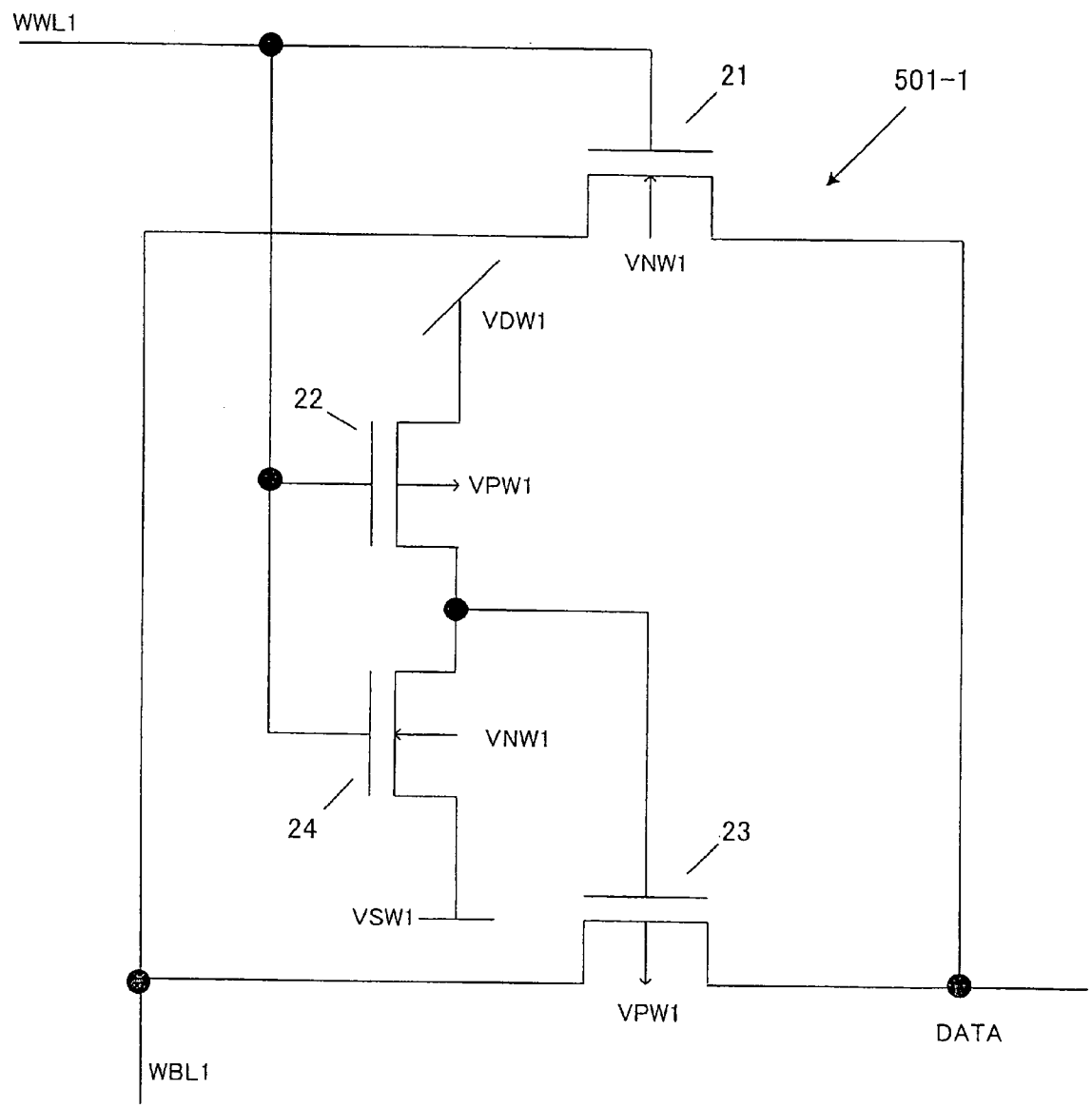
FIG. 7 is a circuit diagram showing a second configuration of the writing section in the first embodiment of the present invention.
Figure 8A:
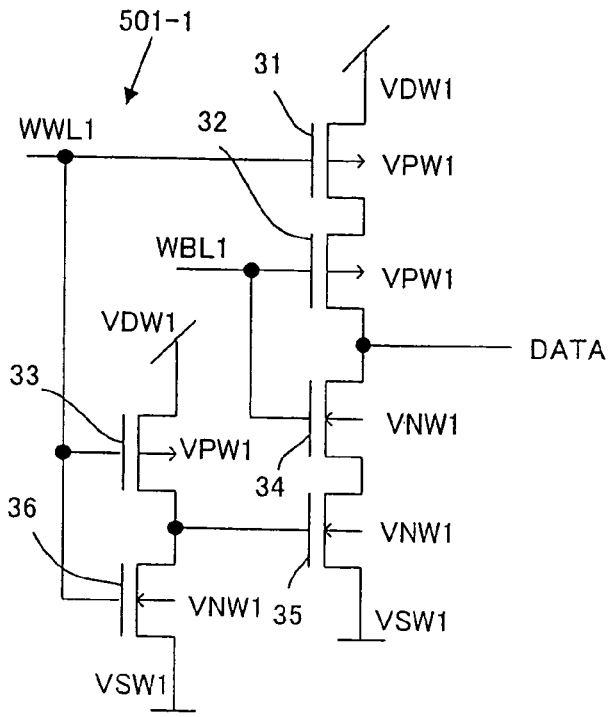
FIG. 8A is a circuit diagram showing a third configuration of the writing section in the first embodiment of the present invention.
Figure 8B:
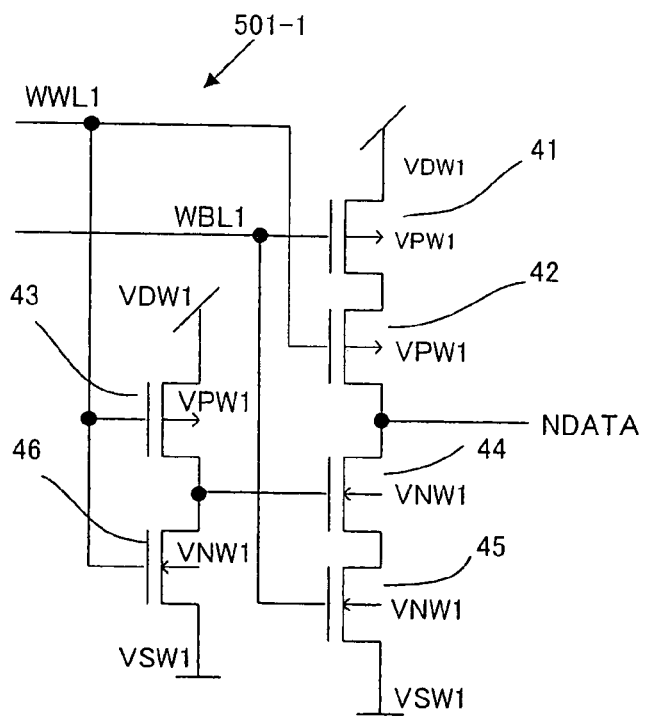
FIG. 8B is a circuit diagram showing a fourth configuration of the writing section in the first embodiment of the present invention.
Figure 9:
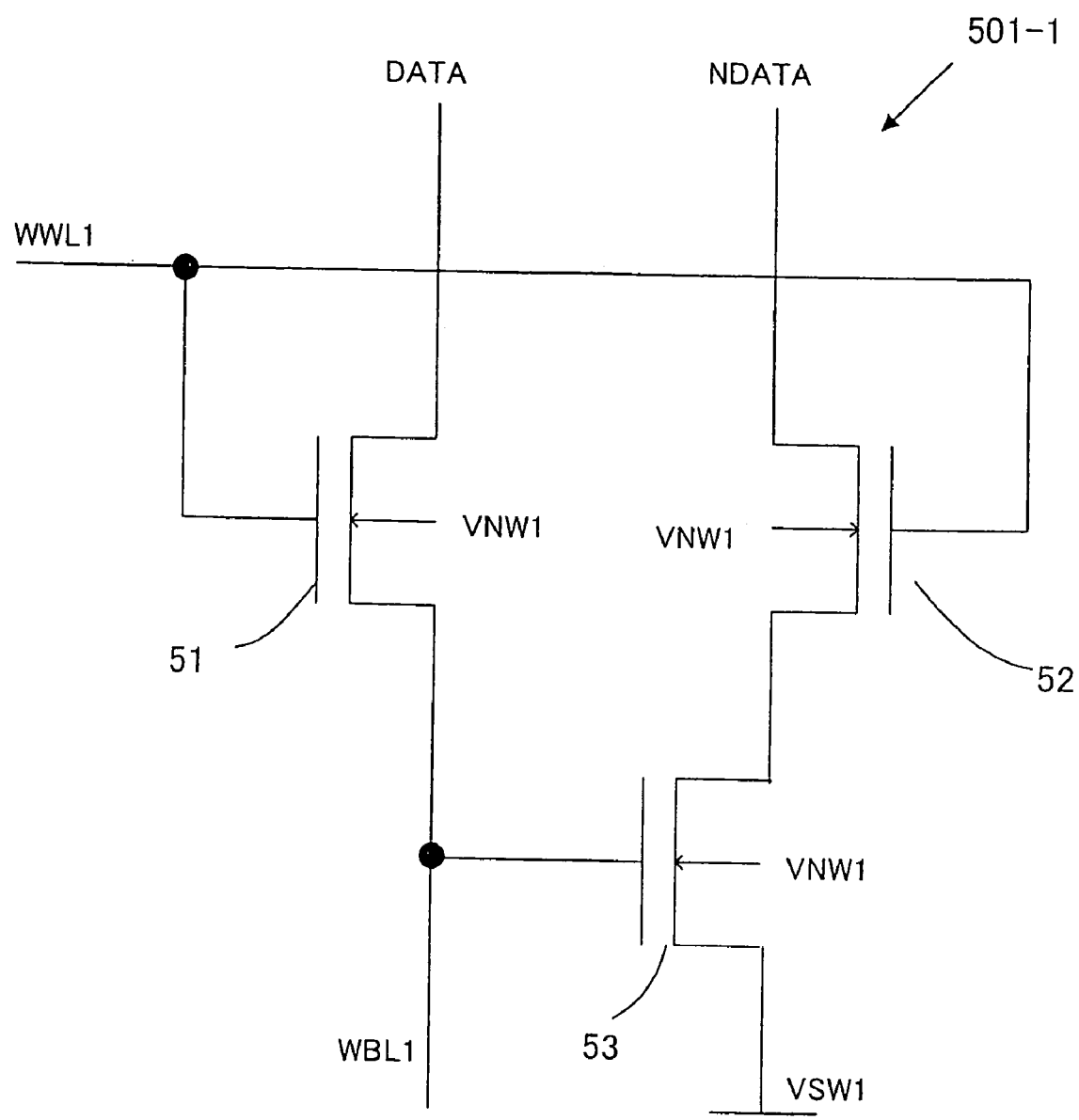
FIG. 9 is a circuit diagram showing a fifth configuration of the writing section in the first embodiment of the present invention.

A configuration where the selection potential of the write word line WWL1 is set to VSW1, and the non-selection potential is set to VDW1 as shown in FIG. 7, a configuration using a tri-state inverter as shown in FIG. 8A or FIG. 8B, a configuration only using N-channel MOS FETs as shown in FIG. 9, or the like may also be employed as a circuit of the writing section other than that shown in FIG. 6.

Herein, description will be made about one writing section 501-1 as a typical example for convenience and similar thing may also be said to other writing sections 501-2 through 501-m. In FIG. 7, reference numerals 22 and 23 represent P-channel MOS FETs, respectively, and reference numerals 21 and 24 represent N-channel MOS FETs, respectively. In addition, in FIG. 8A, reference numerals 31, 32, and 33 represent P-channel MOS FETs, respectively, and reference numerals 34, 35, and 36 represent N-channel MOS FETs, respectively. In addition, in FIG. 8B, reference numerals 41, 42, and 43 represent P-channel MOS FETs, respectively, and reference numerals 44, 45, and 46 represent N-channel MOS FETs, respectively. Moreover, in FIG. 9, reference numerals 51, 52, and 53 represent N-channel MOS FETs, respectively.

It is possible to achieve effects of an improvement in speed of data writing operation by means of applying the forward bias to the writing-section substrate region, and an improvement in cross-talk immunity between the word lines by means of applying the back bias in any cases.

Figure 10:
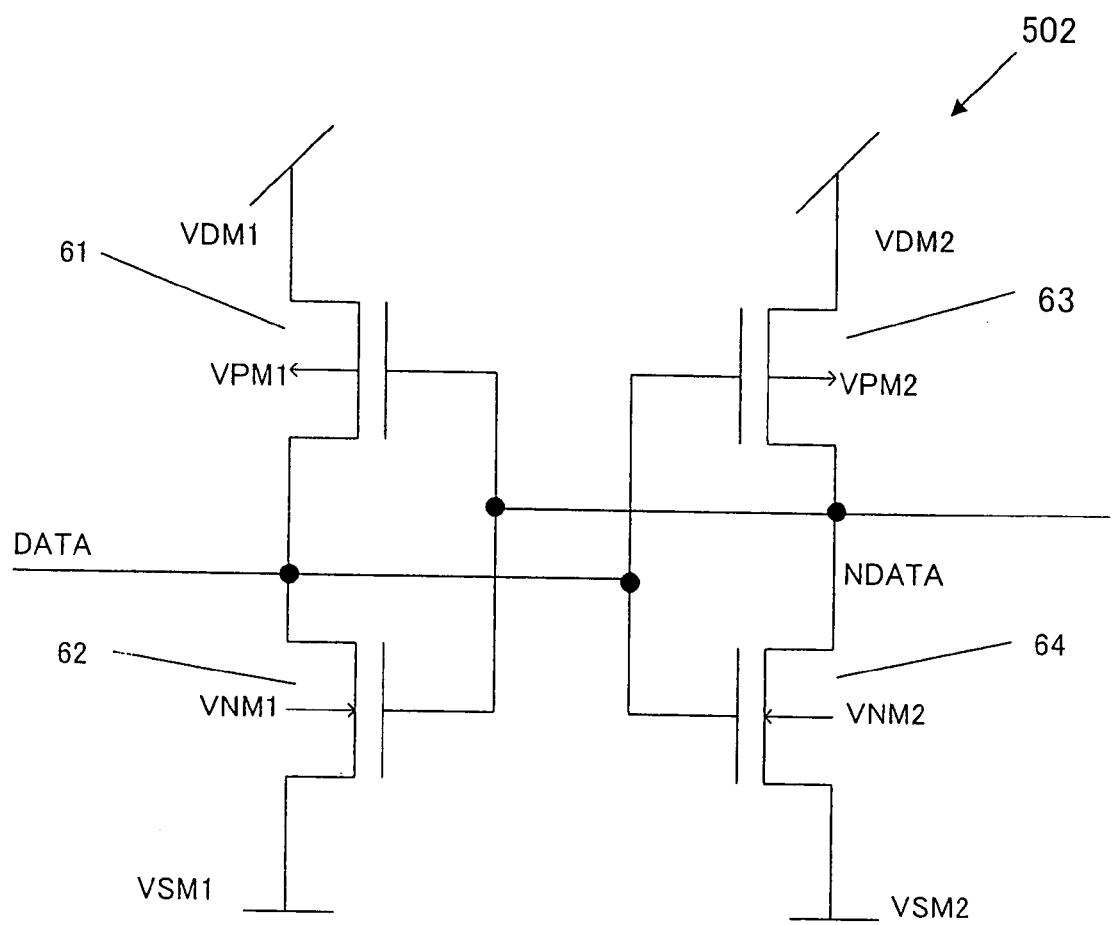
FIG. 10 is a circuit diagram showing a configuration of a storage section in the first embodiment of the present invention.

A specific example of the storage section 502 in FIG. 5A and FIG. 5B is then shown in FIG. 10. The substrate region in which the storage section 502 shown in FIG. 10 is formed is isolated from the substrate region of each of the writing sections 501-1 through 501-m, and the substrate region of each of the reading sections 503-1 through 503-n.

In this storage section 502, substrate potentials VNM1 and VNM2 to be forward biases are applied to N-channel MOS FETs 62 and 64, respectively, and substrate potentials VPM1 and VPM2 to be forward biases are applied to P-channel MOS FETs 61 and 63, respectively, so that stability of the storage circuit, namely "Static Noise Margin" deteriorates as described above, and thereby it becomes easy to write data.

Thus, the forward bias is applied to both or either of the substrate region of the writing sections 501-1 through 501-m and/or the substrate region of the storage section 502, and thereby it is possible to achieve an improvement in speed of data writing operation.

Moreover, in the storage section 502, the substrate potentials VNM1 and VNM2 to be back biases are applied to the N-channel MOS FETs 62 and 64, respectively, and the substrate potentials VPM1 and VPM2 to be back biases are applied to the P-channel MOS FETs 61 and 63, respectively, so that stability of the storage circuit, namely "Static Noise Margin" is improved, and thereby it is possible to achieve an improvement in storage capability.

In the storage section 502, it is possible to set the substrate potential VNM1 and the substrate potential VNM2 at different potentials, respectively, or also at the same potential, and the substrate potential VPM1 and the substrate potential VPM2 are also similar to that mentioned above.

Figure 5B:
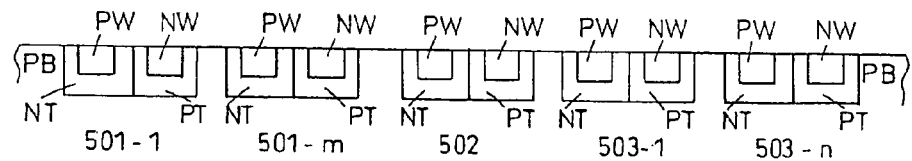
Figure 11:
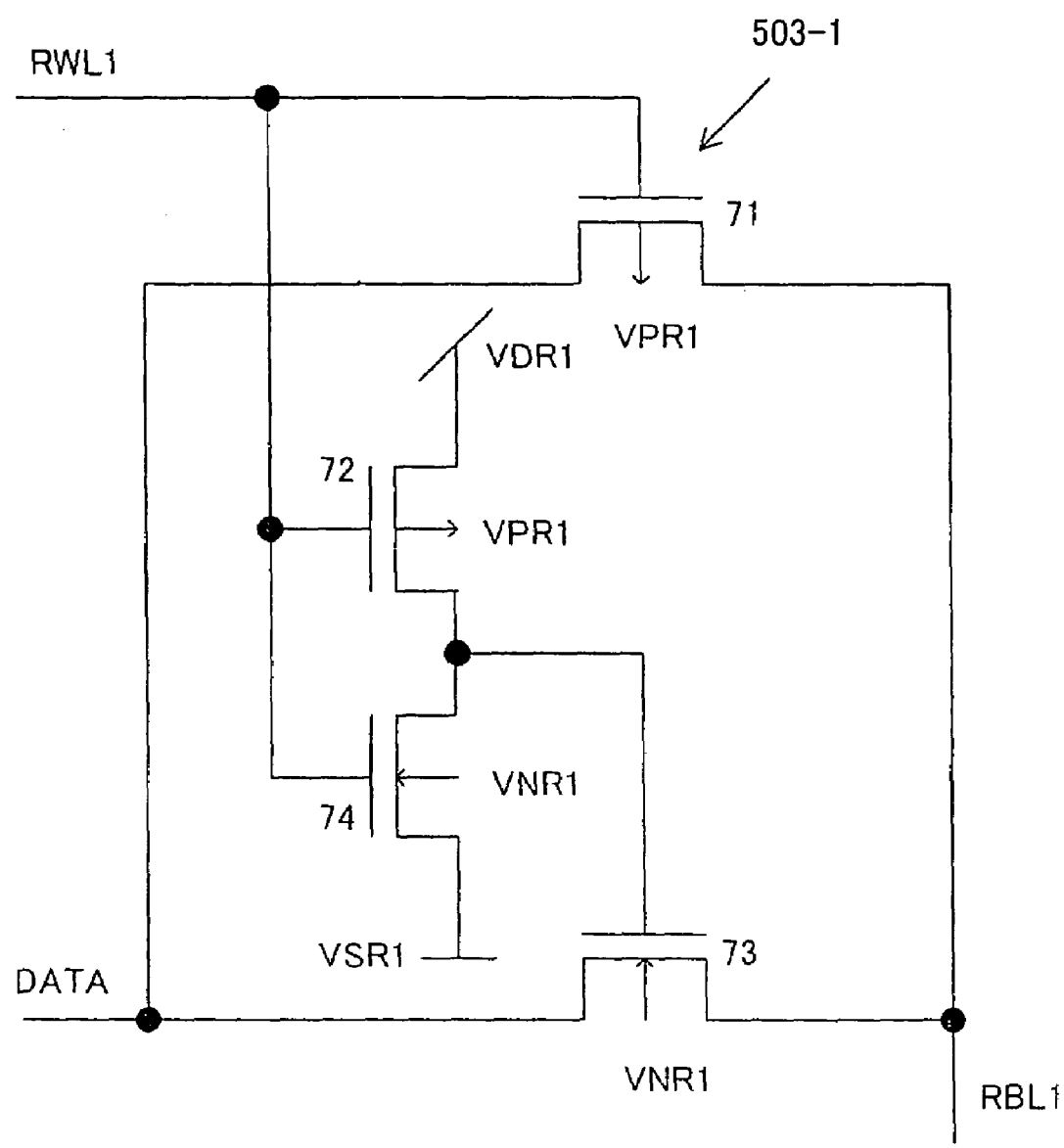
FIG. 11 is a circuit diagram showing a first configuration of a reading section in the first embodiment of the present invention.

A specific example of the reading sections 503-1 through 503-n in FIG. 5 is then shown in FIG. 11. Hereafter, description will be made about one reading section 503-1 as a typical example for convenience and similar thing may also be said to other reading sections 503-2 through 503-n. In FIG. 11, reference numerals 71 and 72 represent P-channel MOS FETs, respectively, and reference numerals 73 and 74 N-channel MOS FETs, respectively.

In the reading section 503-1, either a selection potential VDR1 or a non-selection potential VSR1 is selectively applied to the read word line RWL1 from the row decoder 401. The substrate region of the reading section 503-1 shown in FIG. 11 is isolated from the substrate region of each of the writing sections 501-1 through 501-m, the substrate region of the storage section 502, and the substrate region of each of the reading sections 503-2 through 503-n.

In this reading section 503-1, a substrate potential VNR1 to be a forward bias is applied to N-channel MOS FETs 73 and 74, and a substrate potential VPR1 to be a forward bias is applied to P-channel MOS FETs 71 and 72, and thereby it is possible to increase the drain-source saturation current IDSAT of each of MOS FETs 71 through 74. It is therefore possible to achieve an improvement in speed of data reading operation.

Figure 12:
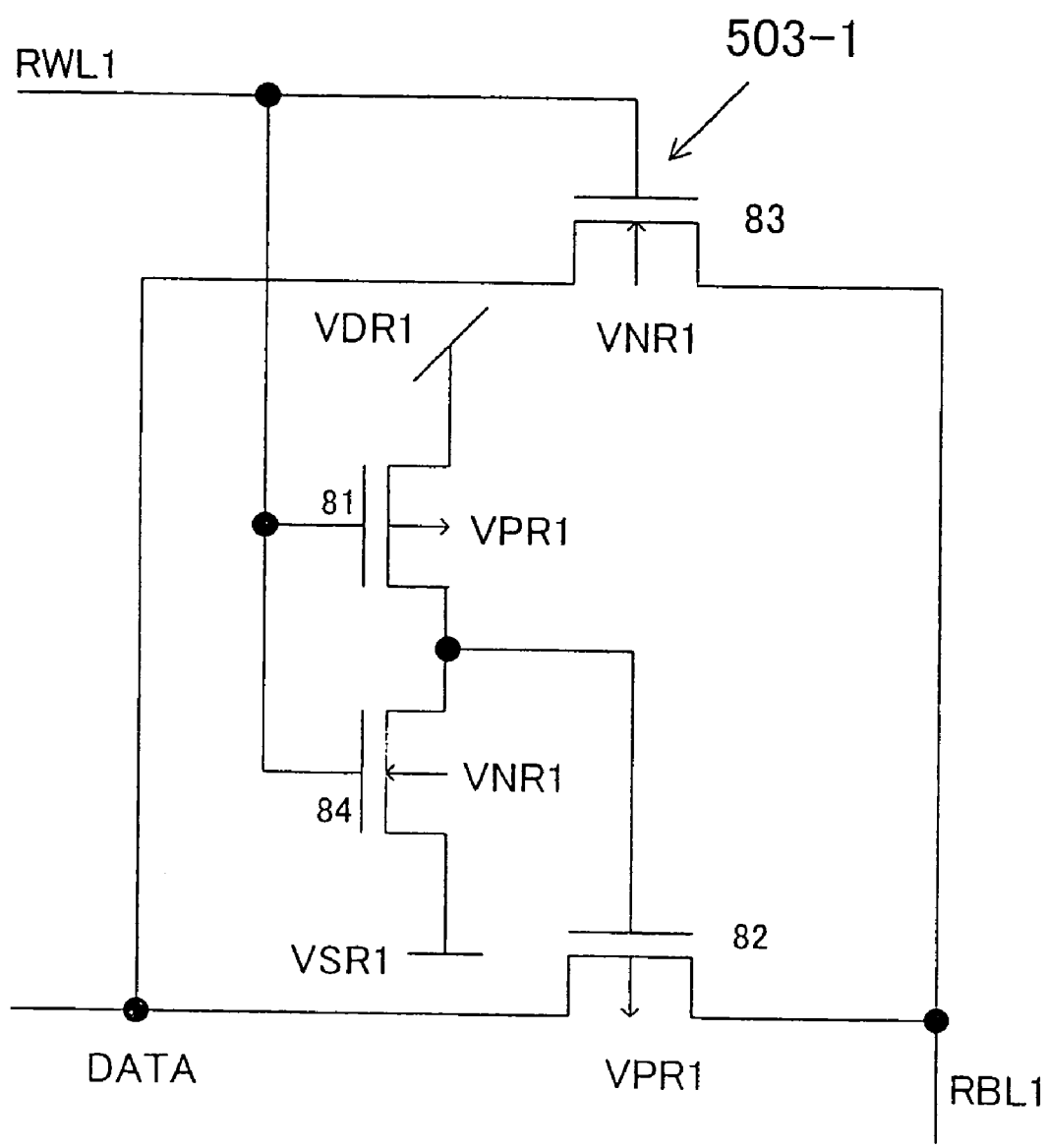
FIG. 12 is a circuit diagram showing a second configuration of the reading section in the first embodiment of the present invention.
Figure 13A:
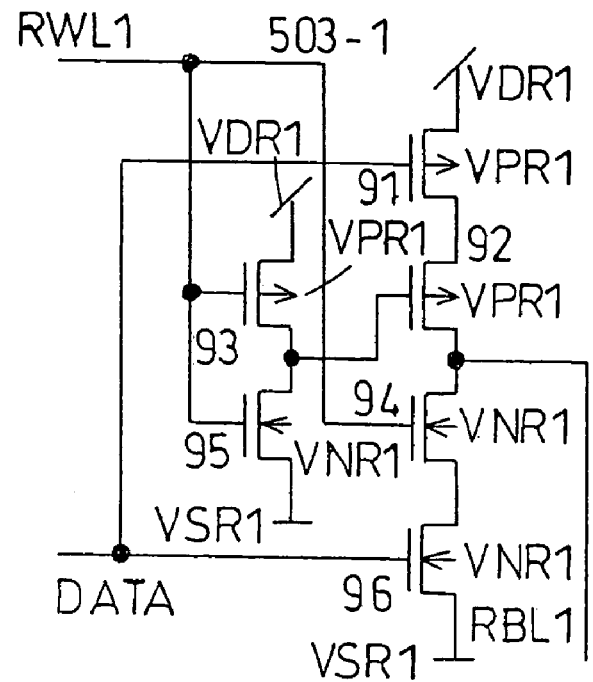
FIG. 13A is a circuit diagram showing a third configuration of the reading section in the first embodiment of the present invention.
Figure 13B:
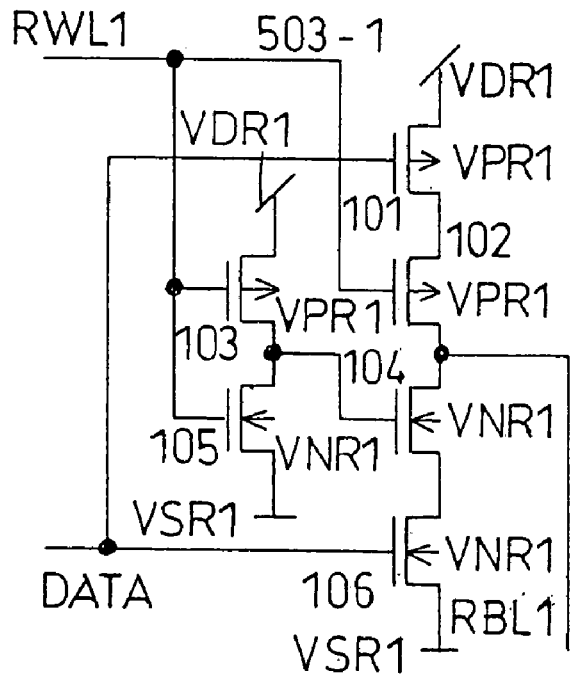
FIG. 13B is a circuit diagram showing a fourth configuration of the reading section in the first embodiment of the present invention.
Figure 14:
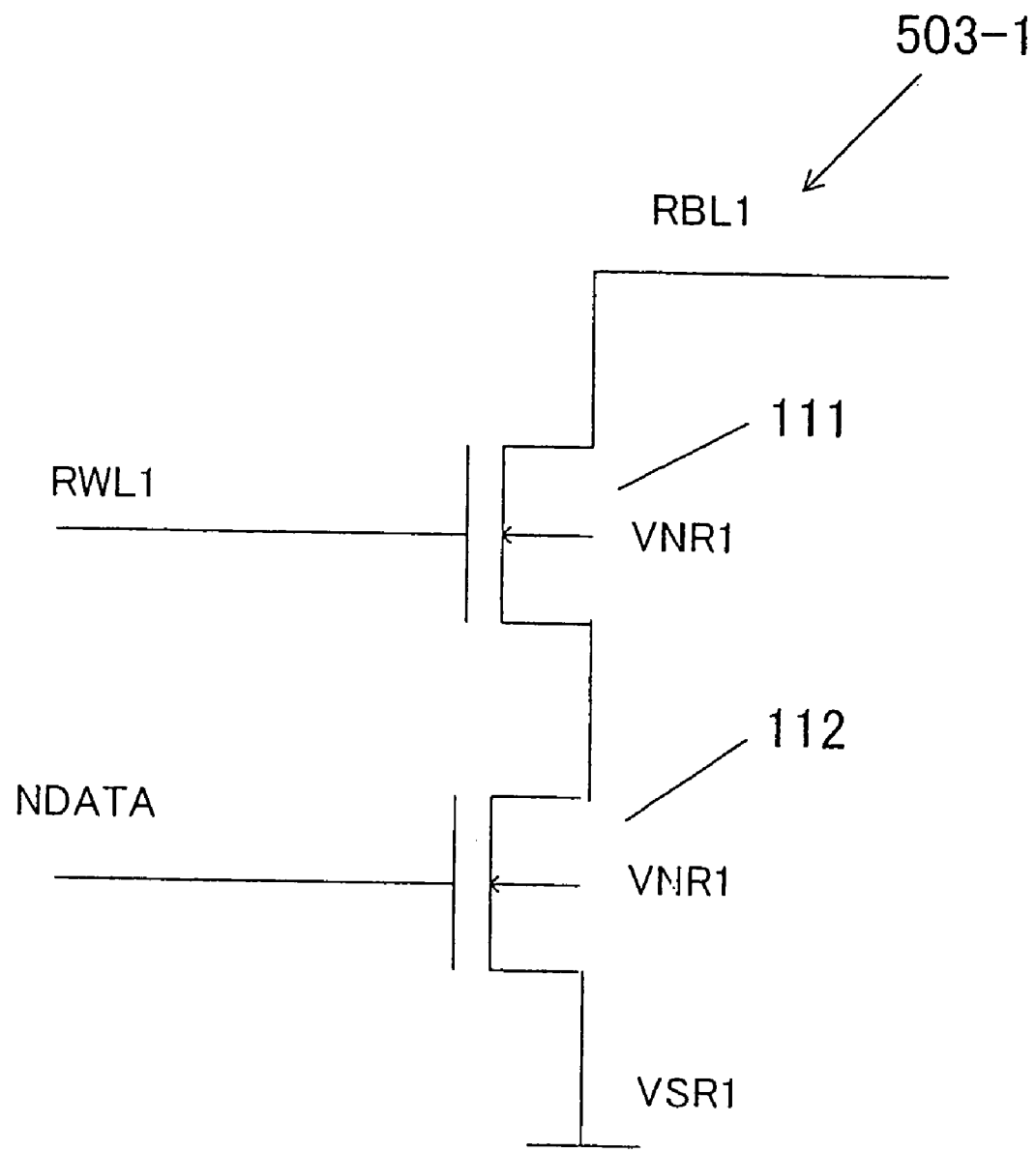
FIG. 14 is a circuit diagram showing a fifth configuration of the reading section in the first embodiment of the present invention.

A configuration where the selection potential of the read word line RWL1 is set to VSR1, and the non-selection potential is set to VDR1 as shown in FIG. 12, a configuration using a tri-state inverter as shown in FIG. 13A or FIG. 13B, a configuration only using N-channel MOS FETs as shown in FIG. 14, or the like may also be employed as a circuit of the reading section other than that shown in FIG. 11.

Herein, description will be made about one reading section 503-1 as a typical example for convenience and similar thing may also be said to other reading sections 503-2 through 503-n. In FIG. 12, reference numerals 81 and 82 represent P-channel MOS FETs, respectively, and reference numerals 83 and 84 represent N-channel MOS FETs, respectively. In addition, in FIG. 13A, reference numerals 91 through 93 represent P-channel MOS FETs, respectively, and reference numerals 94 through 96 represent N-channel MOS FETs, respectively. In addition, in FIG. 13B, reference numerals 101 through 103 represent P-channel MOS FETs, respectively, and reference numerals 104 through 106 represent N-channel MOS FETs, respectively. In FIG. 14, reference numerals 111 and 112 represent N-channel MOS FETs.

A forward bias is applied to the reading-section substrate region, and thereby it is possible to achieve an improvement in speed of data reading operation in any cases.

Moreover, a back bias is applied to all or at least one of the respective substrate regions of each of the writing sections 501-1 through 501-m, the storage section 502, and each of the reading sections 503-1 through 503-n, so that a leakage current when a MOS FET on the substrate region, to which the back bias is applied, turns off is decreased, and thereby it is possible to achieve a reduction in power consumption.

Incidentally, although all of the substrate region of the reading section, the substrate region of the writing section, and the substrate region of the storage section are isolated from each other in the above embodiment, it may not be necessary to configure like that. For example, although the substrate regions of the storage section and the writing section are isolated, the substrate region of the reading section may be common with either the substrate region of the storage section or the substrate region of the writing section. Similarly, although the substrate regions of the storage section and the reading section are isolated, the substrate region of the writing section may be common with either the substrate region of the storage section or the substrate region of the reading section. Moreover, although the substrate regions of the reading section and the writing section are isolated, the substrate region of the storage section may be common with either the substrate region of the writing section or the substrate region of the reading section.

(Second Embodiment)

A substrate potential is fixedly applied to each of substrate regions of each of the writing sections 501-1 through 501-m, the storage section 502, and each of the reading sections 503-1 through 503-n as described above, and thereby it is possible to constantly achieve effects of an improvement in speed of circuit operation, an improvement in cross-talk immunity, an improvement in storage capability, and a reduction in power consumption.

However, required effects are different depending on circuit operations in the semiconductor integrated circuit including the storage section 502, for example, an improvement in speed of each circuit operation may be required when carrying out a data writing operation and a data reading operation, a reduction in power consumption may be required when not carrying out them, or the like.

Five operation modes of a high-speed write mode, a cross-talk immunity improvement mode, a high-speed read mode, a storage mode, and a low leakage current mode are provided based on above aspect, and the circuit operation is dynamically made a transition between respective operation modes depending on the operating state of the storage circuit (the storage section, the writing section, and the reading section), and thereby it is possible to achieve effects of an improvement in speed of circuit operation, an improvement in cross-talk immunity, an improvement in storage capability, and a reduction in power consumption depending on the operating state of the storage circuit.

FIG. 15 shows how to apply a substrate potential to each substrate region of the writing section 501, the storage section 502, and the reading section 503 in each operation mode. Hereafter, description will be made of a relationship between the circuit operation and each operation mode.

The high-speed write mode is achieved by means of applying a forward bias to both or either of the substrate regions of the writing sections 501-1 through 501-m which carry out the data writing operation into the storage section 502 and/or the substrate region of the storage section 502. When carrying out the data writing operation into the storage section 502, the writing section which carries out the data writing operation is made a transition to the high-speed write mode, and thereby it is possible to achieve an improvement in speed of data writing operation.

The cross-talk immunity improvement mode is achieved by means of applying a back bias to the substrate regions of the writing sections 501-1 through 501-m which do not carry out the data writing operation into the storage section 502. When there exists a writing section which does not carry out the data writing operation into the storage section 502, the writing section which does not carry out the data writing operation is made a transition to the cross-talk immunity improvement mode, and thereby it is possible to prevent an incorrect data writing caused by cross-talk.

The high-speed read mode is achieved by means of applying a forward bias to the substrate regions of the reading sections 503-1 through 503-n which carry out the data reading operation from the storage section 502. When carrying out the data reading operation from the storage section 502, the reading sections 503-1 through 503-n which carry out the data reading operation are made a transition to the high-speed read mode, and thereby it is possible to achieve an improvement in speed of data reading operation.

The storage mode is achieved by means of applying a back bias to the substrate region of the storage section 502. When not carrying out the data writing operation into the storage section 502, it is possible to improve data stability of the storage section 502 by means of making a transition to the storage mode.

The low leakage current mode is achieved by means of applying a back bias to all or at least one of the substrate regions of the reading sections 503-1 through 503-n, the substrate regions of the writing sections 501-1 through 501-m, and the substrate region of the storage section 502. When not carrying out the data reading operation from the storage section 502 and the data writing operation into the storage section 502, a reduction in leakage current, namely a reduction in power consumption, can be achieved by making a transition to the low leakage current mode.

(Third Embodiment)

As mentioned above, the operation mode is made a transition, and thereby it is possible to achieve effects of an improvement in speed of circuit operation, an improvement in cross-talk immunity, an improvement in storage capability, and a reduction in power consumption depending on the operating state of the storage circuit. However, the change in the substrate potential is generally slower as compared with the circuit operation, and it takes time for the substrate potential to make a transition after a transition of the operation mode is directed.

In such a case, the circuit operation is predicted, a transition of the operation mode is precedingly directed depending on the prediction result, and thereby it is possible to attain a transition of the operation mode based on the actual circuit operation.

Figure 16A:
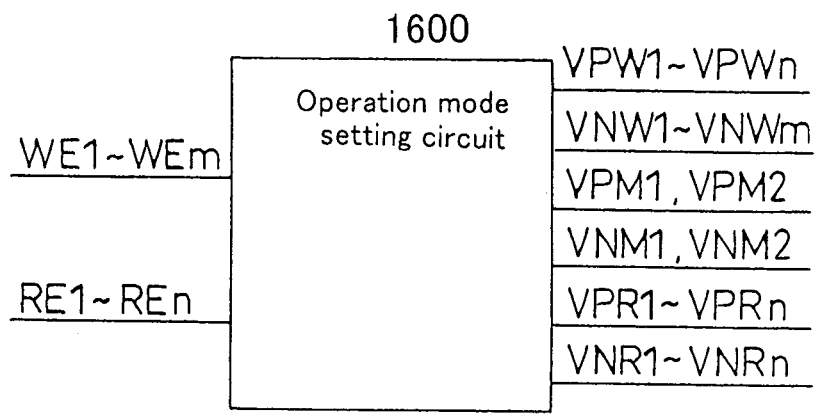
FIG. 16A is a rough circuit diagram of an operation mode setting circuit in a third embodiment of the present invention.

An embodiment of a circuit for predicting the circuit operation is shown in FIG. 16A.

Figure 16B:
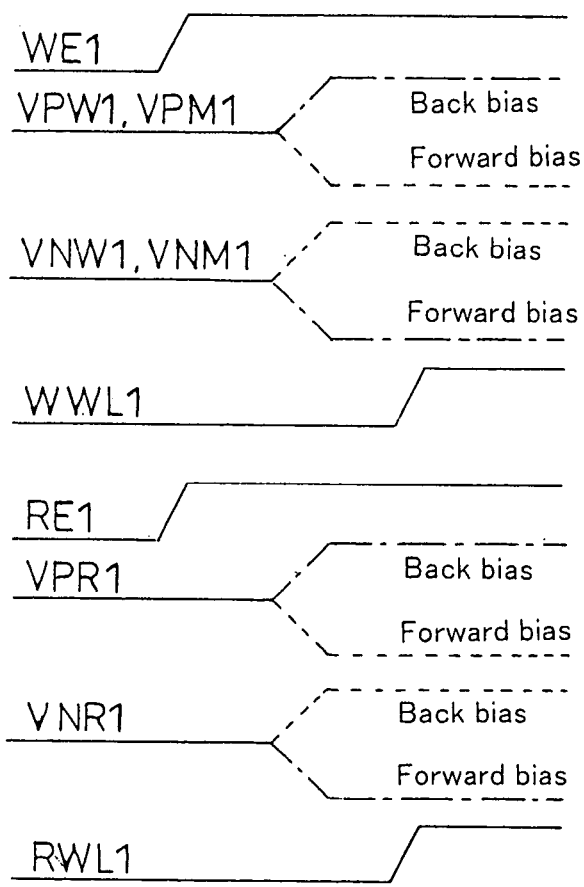
FIG. 16B is a timing chart showing each signal timing of the operation mode setting circuit in the third embodiment of the present invention.

In FIG. 16A, an operation mode setting circuit 1600 is achieved by a configuration which receives write enable signals WE1 through WEm which indicate an operation of the writing sections 501-1 through 501-m, and read enable signals RE1 through REn which indicate an operation of the reading sections 503-1 through 503-n in advance, and generates substrate potentials VNW1 through VNWm and VPW1 through VPWm of the writing sections 501-1 through 501-m, substrate potentials VNM1, VNM2, VPM1, and VPM2 of the storage section 502, and substrate potentials VNR1 through VNRn and VPR1 through VPRn of the reading sections 503-1 through 503-n according to each signal before the storage circuit actually operates. An example of a timing chart of each signal is shown in FIG. 16B.

Figure 17:
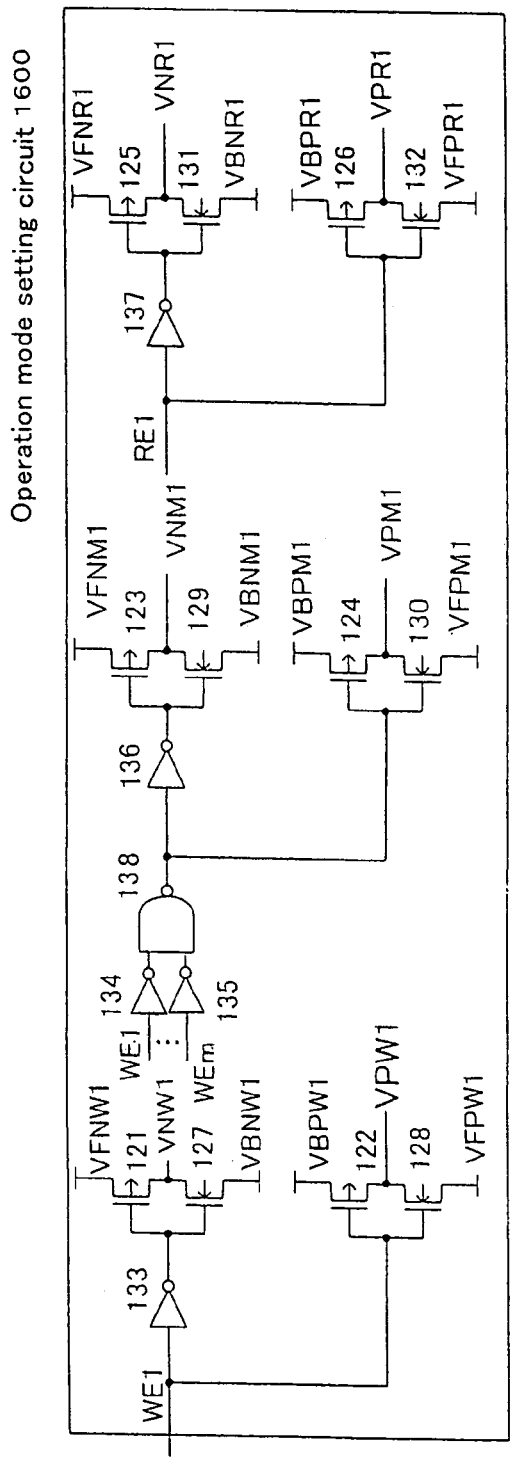
FIG. 17 is a circuit diagram showing a specific example of the operation mode setting circuit in the third embodiment of the present invention.

A specific example of the operation mode setting circuit 1600 is shown in FIG. 17. Hereafter, description will be made about one of the respective writing section and reading section as a typical example for convenience and similar thing may also be said to other writing sections and reading sections. In FIG. 17, reference numerals 121 through 126 represent P-channel MOS FETs, respectively, reference numerals 127 through 132 represent N-channel MOS FETs, respectively, reference numerals 133 through 137 represent inverters, respectively, and a reference numeral 138 represents a NAND circuit.

The substrate potential of the writing section 501-1 is generated by the write enable signal WE1. When the write enable signal WE1 is in a selection potential, forward biases VFNW1 and VFPW1 are selected as the substrate potentials VNW1 and VPW1, respectively, and when the write enable signal WE1 is in a non-selection potential, back biases VBNW1 and VBPW1 are selected as the substrate potentials VNW1 and VPW1, respectively.

Moreover, the substrate potential of the storage section 502 is generated using the write enable signals WE1 through WEm, and when at least one of the write enable signals WE1 through WEm is in a selection potential, forward biases VFNM1 and VFPM1 are selected as the substrate potentials VNM1 and VPM1, respectively, and when all the write enable signals WE1 through WEm are in a non-selection potential, back biases VBNM1 and VBPM1 are selected as the substrate potentials VNM1 and VPM1, respectively. Substrate potentials VNM2 and VPM2 are similar to those described above.

The substrate potential of the reading section 503-1 is generated by the read enable signal RE1. When the read enable signal RE1 is in a selection potential, forward biases VFNR1 and VFPR1 are selected as the substrate potentials VNR1 and VPR1, respectively, and when the read enable signal RE1 is in a non-selection potential, back biases VBNR1 and VBPR1 are selected as the substrate potentials VNR1 and VPR1, respectively.

(Fourth Embodiment)

Figure 18A:
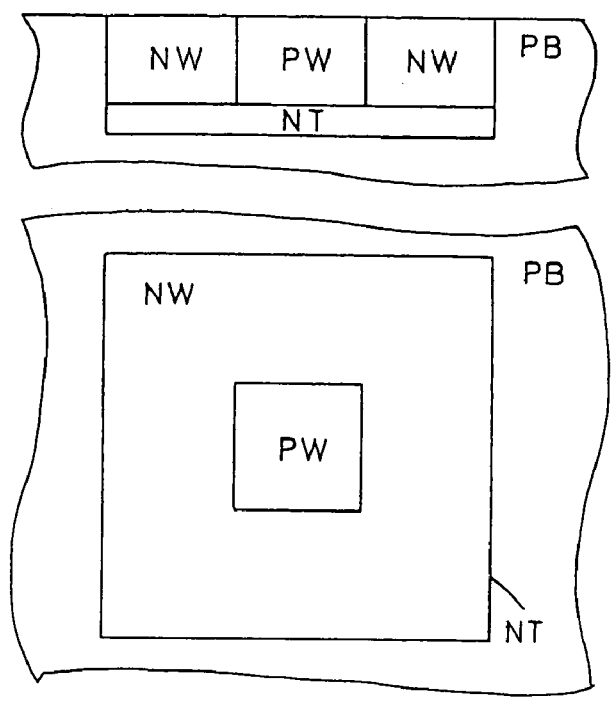
FIG. 18A is a rough sectional view and plan view showing of a substrate isolation layout.
Figure 18B:
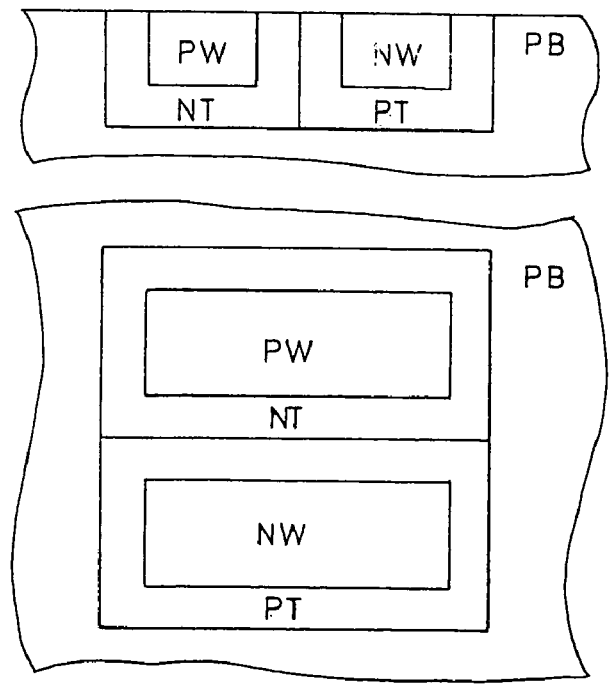
FIG. 18B is a rough sectional view and plan view showing of a substrate isolation layout.

In the storage circuit where the memory cells are arranged in a matrix shape as shown in FIG. 4, there is shown an outline of a layout of each portion in FIG. 18A and FIG. 18B when the substrates of each writing section, the storage section, and each reading section are isolated from each other in each memory cell unit. Hereafter, description will be made about the writing section 501-1 as a typical example and similar thing may also be said to other each writing section, storage section, and each reading section. The upper figures in FIG. 18A and FIG. 18B are sectional views showing the layout, and the lower figures in FIG. 18A and FIG. 18B are plane views given by viewing the layout from the above. In FIG. 18A and FIG. 18B, symbol NW represents n-substrate region and symbol PW represents p-substrate region. Symbol NT represents an n-substrate region for isolating the substrate, and symbol PT represents a p-substrate region for isolating the substrate. These are isolation regions for isolating the n-substrate region NW and the p-substrate region PW. Symbol PB represents a p-type substrate.

Figure 19A:
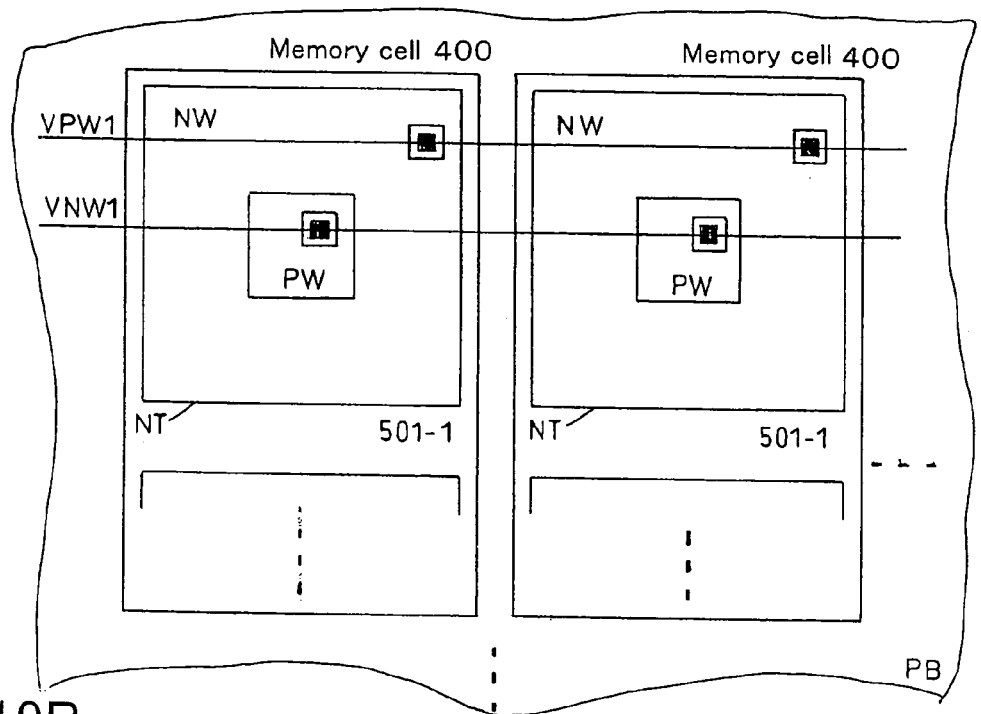
FIG. 19A is a rough plan view showing a substrate isolation layout in the first embodiment of the present invention.
Figure 19B:
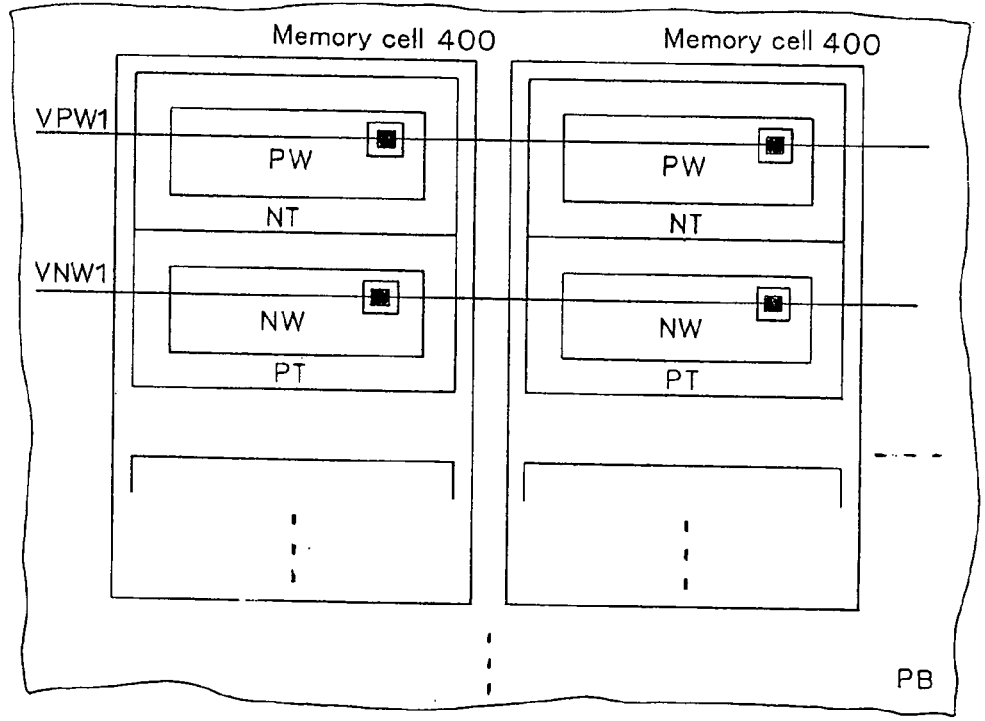
FIG. 19B is a rough plan view showing another substrate isolation layout in the first embodiment of the present invention.

When the substrate regions of each writing section, the storage section, and each reading section are isolated from each other, it is necessary to isolate the n-substrate region NT in FIG. 18A, and to isolate the n-substrate region NT and the p-substrate region PT in FIG. 18B. For that reason, in the storage circuit where the memory cells are arranged in a matrix shape as shown in FIG. 4, outlines of layouts in FIG. 18A and FIG. 18B become those in FIG. 19A and FIG. 19B, respectively. As can be seen from FIG. 19A and FIG. 19B, an isolation region is required also between adjacent memory cells other than between each writing section, the storage section, and each reading section. For that reason, a considerable layout circuit area will be required.

Herein, with regard to the memory cells 400 arranged in each row direction in FIG. 4, namely the memory cells connected to the same write word line and the read word line, the operations of each of the writing sections 501-1 through 501-m, storage section 502, and each of the reading sections 503-1 through 503-n are common, respectively. That is, when carrying out the data writing operation in the storage section 502 in a certain memory cell 400 via, for example the writing section 501-1, writing sections 501-1 in other memory cells 400 arranged in the same row as the memory cell 400 will carry out the data writing operation altogether.

Figure 20A:
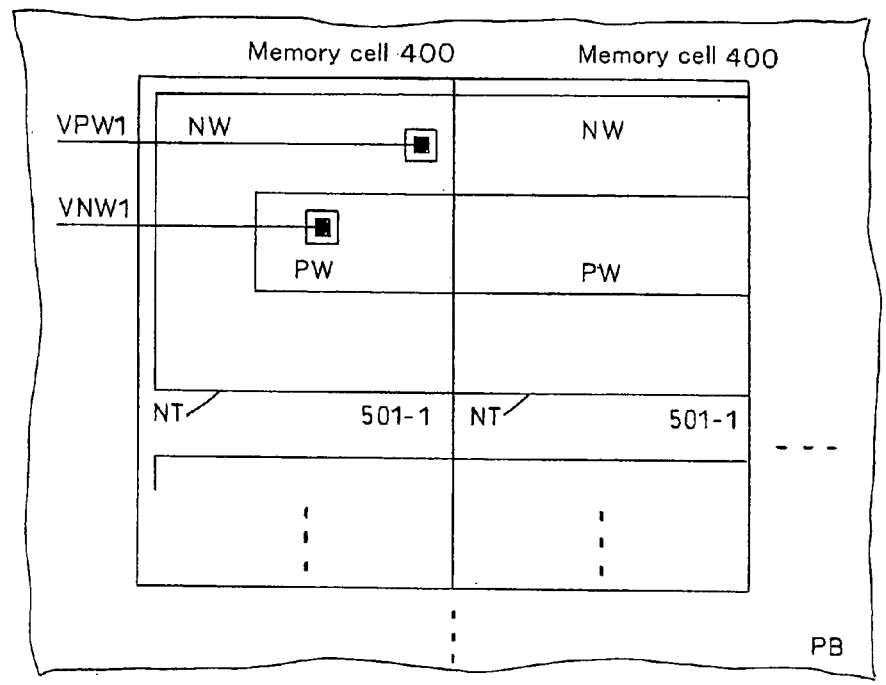
FIG. 20A is a rough plan view showing a substrate isolation layout in the fourth embodiment of the present invention.
Figure 20B:
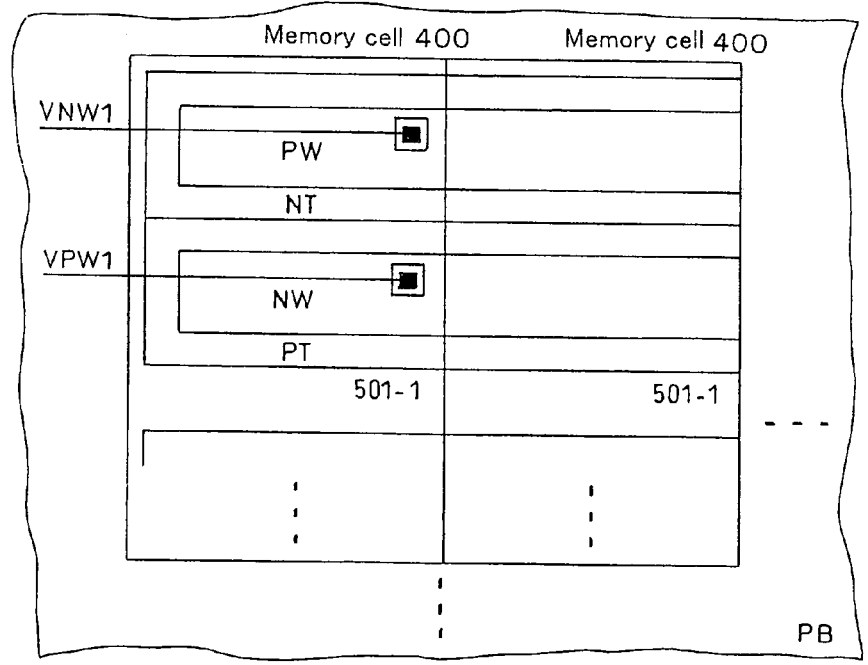
FIG. 20B is a rough plan view showing another substrate isolation layout in the fourth embodiment of the present invention.
Figure 21:
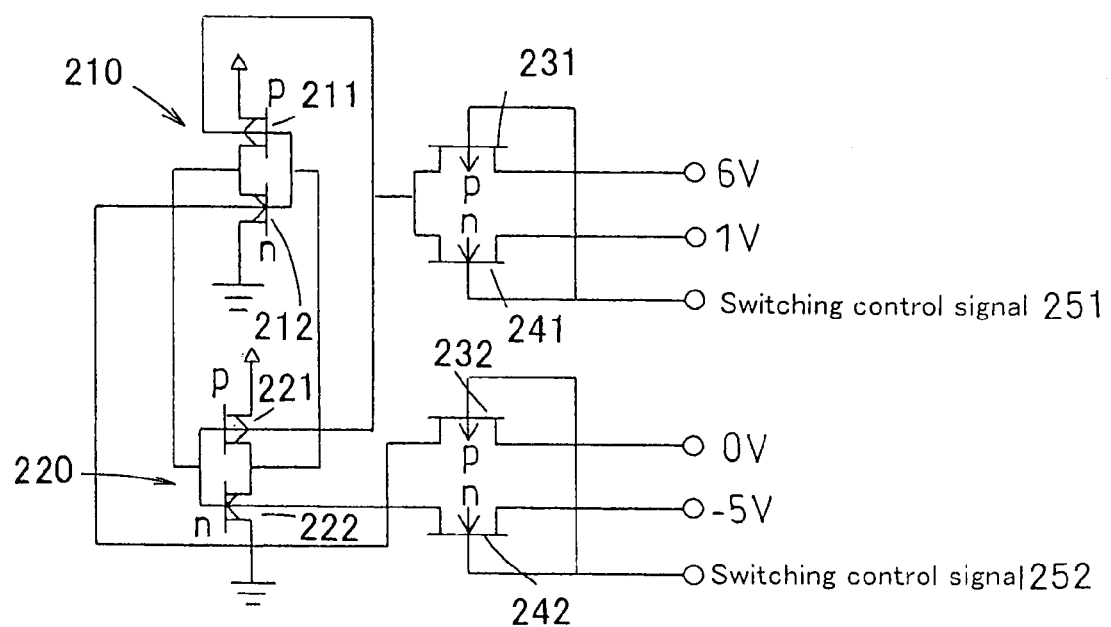
FIG. 21 is a circuit diagram for describing a substrate potential selection technique of a storage section in a prior art.

It is therefore possible to commonly unify the substrate regions of the writing sections 501-1 through 501-m, the storage section 502, and the reading sections 503-1 through 503-n, respectively, within the memory cells arranged in the same row as shown in FIG. 20A and FIG. 20B.

An isolation region between the substrates in a column direction is not needed between adjacent memory cells by means of employing a configuration shown in FIG. 20A and FIG. 20B. It is therefore possible to achieve a reduction in layout circuit area. Moreover, the substrate potential becomes common between the memory cells arranged in the same row, so that it is not needed to provide each memory cell with the substrate potential by means of a power apply interconnection in a row direction, and thereby it is possible to achieve a reduction in layout circuit area of this interconnection.

According to the embodiment of the present invention, following effects can be obtained as has been described above. In the semiconductor integrated circuit including the storage circuit, the substrates of each writing section, the storage section, and each reading section are isolated from each other, and bias voltages of various combinations are applied to each substrate section, and thereby it is possible to achieve an improvement in speed of circuit operation, an improvement in cross-talk immunity, an improvement in storage capability, and a reduction in power consumption. The operation modes specified based on a combination of how to apply substrate bias voltage to each writing section, the storage section, and each reading section are provided, and the transition between the respective operation modes is carried out depending on the circuit operation, and thereby it is possible to achieve the effect based on the circuit operation. Further, the circuit operation is predicted and the transition between the operation modes is controlled, and thereby it is also adaptable to a case where quick response of the substrate potential is inferior. Moreover, a layout which shares the substrate between memory cells is provided, so that the substrate isolation region and the power apply interconnection are reducible, and thereby it is possible to achieve a reduction in layout circuit area.

What is claimed is:

1. A semiconductor integrated circuit, comprising a memory cell having a storage section, a writing section, and a reading section, wherein:
    said memory cell is comprised in a single surface, and a substrate in which said memory cell is formed is isolated into a plurality of regions comprising:
        a storage-section substrate region in which said storage section is formed,
        a writing-section substrate region in which said writing section is formed, and
        a reading-section substrate region in which said reading section is formed.

2. The semiconductor integrated circuit according to claim 1, wherein independent substrate wirings are connected to said storage-section substrate region, said writing-section substrate region, and said reading-section substrate region, respectively.

3. The semiconductor integrated circuit according to claim 1, wherein a forward bias is applied to both or either of said storage-section substrate region and/or said writing-section substrate region.

4. The semiconductor integrated circuit according to claim 1, wherein a back bias is applied to said writing-section substrate region.

5. The semiconductor integrated circuit according to claim 1, wherein a back bias is applied to said storage-section substrate region.

6. The semiconductor integrated circuit according to claim 1, wherein a forward bias is applied to said reading-section substrate region.

7. The semiconductor integrated circuit according to claim 1, wherein a back bias is applied to all or at least one of said storage-section substrate region, said writing-section substrate region, and said reading-section substrate region.

8. The semiconductor integrated circuit according to claim 1, wherein the semiconductor integrated circuit comprises a high-speed write mode by which a forward bias is applied to both or either of said storage-section substrate region and/or said writing-section substrate region; a cross-talk immunity improvement mode by which a back bias is applied to said writing-section substrate region; a high-speed read mode by which a forward bias is applied to said reading-section substrate region; a storage mode by which a back bias is applied to said storage-section substrate region; and a low leakage current mode by which a back bias is applied to all or at least one of said storage-section substrate region, said writing-section substrate region, and said reading-section substrate region, and wherein a transition is made to either of said high-speed write mode, said cross-talk immunity improvement mode, said high-speed read mode, said storage mode, or said low leakage current mode depending on operating states of said storage section, said writing section, and said reading section.

9. The semiconductor integrated circuit according to claim 8, wherein when writing data in said storage section, a transition is made to said high-speed write mode.

10. The semiconductor integrated circuit according to claim 8, wherein when there exists said writing section that does not write data in said storage section, a writing storage-section substrate region in which said writing section that does not write data in said storage section is formed is made a transition to said cross-talk immunity improvement mode.

11. The semiconductor integrated circuit according to claim 8, wherein when reading data from said storage section, a transition is made to said high-speed read mode.

12. The semiconductor integrated circuit according to claim 8, wherein when not writing data in said storage section, a transition is made to said storage mode.

13. The semiconductor integrated circuit according to claim 8, wherein when not reading data from said storage section and not writing data in said storage section, a transition is made to said low leakage current mode.

14. The semiconductor integrated circuit according to claim 8, wherein the operating states of said storage section, said writing section, and said reading section are predicted, and then a transition is made to either of said high-speed write mode, said cross-talk immunity improvement mode, said high-speed read mode, said storage mode, or said low leakage current mode depending on the prediction result.

15. The semiconductor integrated circuit according to claim 1, wherein the semiconductor integrated circuit comprises a configuration adjacently provided with a plurality of said memory cells, and wherein all of said adjacent storage-section substrate regions, all of said adjacent writing-section substrate regions, and all of said adjacent reading-section substrate regions are unified, respectively, in a plurality of adjacent memory cells.

16. The semiconductor integrated circuit according to claim 1, wherein the semiconductor integrated circuit comprises a configuration adjacently provided with a plurality of said memory cells, and wherein all of said adjacent storage-section substrate regions, all of said adjacent writing-section substrate regions, and all of said adjacent reading-section substrate regions are unified, respectively, in a plurality of adjacent memory cells, so that an isolation region is eliminated.

17. The semiconductor integrated circuit according to claim 1, wherein the semiconductor integrated circuit comprises a configuration adjacently provided with a plurality of said memory cells, and wherein all of said adjacent storage-section substrate regions, all of said adjacent writing-section substrate regions, and all of said adjacent reading-section substrate regions are unified, respectively, in a plurality of adjacent memory cells, so that power supply interconnections for applying substrate potentials between said adjacent storage-section substrate regions, between said adjacent writing-section substrate regions, and between said adjacent reading-section substrate regions are eliminated.

18. A semiconductor integrated circuit, comprising:
a memory cell having a storage section;
a writing section; and
a reading section, wherein:
a substrate in which said memory cell is formed is isolated into a plurality of regions comprising:
a storage-section substrate region in which said storage section is formed,
at least one writing-section substrate region in which said writing section is formed, and
at least one reading-section substrate region in which said reading section is formed.

19. The semiconductor integrated circuit according to claim 18, wherein independent substrate wirings are connected to said storage-section substrate region, said writing-section substrate region, and said reading-section substrate region, respectively.

20. The semiconductor integrated circuit according to claim 18, wherein a forward bias is applied to both or either of said storage-section substrate region and/or said writing-section substrate region.

21. The semiconductor integrated circuit according to claim 18, wherein a back bias is applied to said writing-section substrate region.

22. The semiconductor integrated circuit according to claim 18, wherein a back bias is applied to said storage-section substrate region.

23. The semiconductor integrated circuit according to claim 18, wherein a forward bias is applied to said reading-section substrate region.

24. The semiconductor integrated circuit according to claim 18, wherein a back bias is applied to all or at least one of said storage-section substrate region, said writing-section substrate region, and said reading-section substrate region.

25. The semiconductor integrated circuit according to claim 18, wherein the semiconductor integrated circuit comprises a high-speed write mode by which a forward bias is applied to both or either of said storage-section substrate region and/or said writing-section substrate region; a cross-talk immunity improvement mode by which a back bias is applied to said writing-section substrate region; a high-speed read mode by which a forward bias is applied to said reading-section substrate region; a storage mode by which a back bias is applied to said storage-section substrate region; and a low leakage current mode by which a back bias is applied to all or at least one of said storage-section substrate region, said writing-section substrate region, and said reading-section substrate region, and wherein a transition is made to either of said high-speed write mode, said cross-talk immunity improvement mode, said high-speed read mode, said storage mode, or said low leakage current mode depending on operating states of said storage section, said writing section, and said reading section.

26. The semiconductor integrated circuit according to claim 25, wherein when writing data in said storage section, a transition is made to said high-speed write mode.

27. The semiconductor integrated circuit according to claim 25, wherein when there exists said writing section that does not write data in said storage section, a writing storage-section substrate region in which said writing section that does not write data in said storage section is formed is made a transition to said cross-talk immunity improvement mode.

28. The semiconductor integrated circuit according to claim 25, wherein when reading data from said storage section, a transition is made to said high-speed read mode.

29. The semiconductor integrated circuit according to claim 25, wherein when not writing data in said storage section, a transition is made to said storage mode.

30. The semiconductor integrated circuit according to claim 25, wherein when not reading data from said storage section and not writing data in said storage section, a transition is made to said low leakage current mode.

31. The semiconductor integrated circuit according to claim 25, wherein the operating states of said storage section, said writing section, and said reading section are predicted, and then a transition is made to either of said high-speed write mode, said cross-talk immunity improvement mode, said high-speed read mode, said storage mode, or said low leakage current mode depending on the prediction result.

32. The semiconductor integrated circuit according to claim 18, wherein the semiconductor integrated circuit comprises a configuration adjacently provided with a plurality of said memory cells, and wherein all of said adjacent storage-section substrate regions, all of said adjacent writing-section substrate regions, and all of said adjacent reading-section substrate regions are unified, respectively, in a plurality of adjacent memory cells.

33. The semiconductor integrated circuit according to claim 18, wherein the semiconductor integrated circuit comprises a configuration adjacently provided with a plurality of said memory cells, and wherein all of said adjacent storage-section substrate regions, all of said adjacent writing-section substrate regions, and all of said adjacent reading-section substrate regions are unified, respectively, in a plurality of adjacent memory cells, so that an isolation region is eliminated.

34. The semiconductor integrated circuit according to claim 18, wherein the semiconductor integrated circuit comprises a configuration adjacently provided with a plurality of said memory cells, and wherein all of said adjacent storage-section substrate regions, all of said adjacent writing-section substrate regions, and all of said adjacent reading-section substrate regions are unified, respectively, in a plurality of adjacent memory cells, so that power supply interconnections for applying substrate potentials between said adjacent storage-section substrate regions, between said adjacent writing-section substrate regions, and between said adjacent reading-section substrate regions are eliminated.

* * * * *